(12) United States Patent
Noh et al.

(10) Patent No.: US 12,376,390 B2
(45) Date of Patent: Jul. 29, 2025

(54) IMAGE SENSOR HAVING A COLOR PIXEL GROUP CONFIGURED TO SENSE A COLOR DIFFERENT FROM RGB COLORS

(71) Applicant: Samsung Electronics Co., Ltd., Suwon-si (KR)

(72) Inventors: Yohwan Noh, Jeongeup-si (KR); Daekwan Kim, Suwon-si (KR); Soyoung Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 377 days.

(21) Appl. No.: 17/747,464

(22) Filed: May 18, 2022

(65) Prior Publication Data

US 2022/0384513 A1    Dec. 1, 2022

(30) Foreign Application Priority Data

May 31, 2021  (KR) ................. 10-2021-0070194
Aug. 13, 2021  (KR) ................. 10-2021-0107536

(51) Int. Cl.
  *H10F 39/18*    (2025.01)
  *H04N 25/13*    (2023.01)
  (Continued)

(52) U.S. Cl.
  CPC ....... *H10F 39/1825* (2025.01); *H04N 25/133* (2023.01); *H04N 25/135* (2023.01);
  (Continued)

(58) Field of Classification Search
  CPC ........ H10F 39/8053; H04N 25/11–136; H04N 25/704; H04N 25/42; H04N 25/443; H04N 25/46; H04N 23/672
  See application file for complete search history.

(56) References Cited

U.S. PATENT DOCUMENTS 6,847,397 B1   1/2005  Osada
7,359,549 B2   4/2008  Ikebe et al.
(Continued)

FOREIGN PATENT DOCUMENTS

EP       3716618 A1    9/2020
JP    2006-270364 A   10/2006
(Continued)

OTHER PUBLICATIONS

Sony "ClearVid Lands" in *Digital Cinema Cameras*. http://image-sensors-world.blogspot.com/2011/04/sony-clearvid-lands-in-digital-cinema.html.
(Continued)

*Primary Examiner* — Younes Boulghassoul
(74) *Attorney, Agent, or Firm* — Harness, Dickey & Pierce, P.L.C.

(57) ABSTRACT

An image sensor includes a plurality of red pixel groups, a first red pixel and a second red pixel adjacent to each other in a first direction; a plurality of green pixel groups, a first green pixel and a second green pixel adjacent to each other in the first direction; a plurality of blue pixel groups, a first blue pixel and a second blue pixel adjacent to each other in the first direction; and at least one color pixel group including a first color pixel and a second color pixel each configured to sense a certain color, the first color pixel and the second color pixel adjacent to each other in a second direction, the at least one color pixel group being between the red pixel groups and the green pixel groups and between the green pixel groups and the blue pixel groups.

20 Claims, 17 Drawing Sheets

(51) Int. Cl.
  *H04N 25/133* (2023.01)
  *H04N 25/46* (2023.01)
  *H04N 25/704* (2023.01)
  *H10F 39/00* (2025.01)

(52) U.S. Cl.
  CPC .......... *H04N 25/136* (2023.01); *H04N 25/46* (2023.01); *H04N 25/704* (2023.01); *H10F 39/8053* (2025.01); *H10F 39/8063* (2025.01)

(56) References Cited

U.S. PATENT DOCUMENTS

| | | | |
|---|---|---|---|
| 7,583,303 B2 | 9/2009 | Mizukura et al. | |
| 7,835,002 B2 | 11/2010 | Muhammed et al. | |
| 9,117,711 B2 | 8/2015 | Suzuki et al. | |
| 9,799,255 B2* | 10/2017 | Won | G09G 3/2003 |
| 9,905,604 B2 | 2/2018 | Murata | |
| 10,425,624 B2 | 9/2019 | Honda | |
| 10,535,687 B2 | 1/2020 | Azami et al. | |
| 10,593,717 B2 | 3/2020 | Tadano | |
| 10,827,112 B2 | 11/2020 | Yoshimura et al. | |
| 2017/0171470 A1* | 6/2017 | Sakioka | H04N 25/134 |
| 2019/0082130 A1* | 3/2019 | Li | H10F 39/807 |
| 2020/0358971 A1* | 11/2020 | Shim | H10F 39/813 |
| 2020/0358989 A1* | 11/2020 | Hoshino | H04N 25/533 |
| 2021/0006726 A1 | 1/2021 | Yoshimura et al. | |
| 2021/0126033 A1* | 4/2021 | Yang | H04N 25/11 |
| 2021/0185286 A1* | 6/2021 | Pang | H04N 25/135 |
| 2021/0344882 A1* | 11/2021 | Park | H04N 25/704 |
| 2021/0385389 A1* | 12/2021 | Lee | H04N 5/265 |
| 2021/0400216 A1* | 12/2021 | Lee | H10F 39/182 |
| 2022/0045110 A1* | 2/2022 | Fujita | H04N 25/704 |
| 2022/0046196 A1* | 2/2022 | Li | H04N 25/78 |
| 2022/0078364 A1* | 3/2022 | Kim | H04N 25/7795 |
| 2022/0086358 A1* | 3/2022 | Jeong | H04N 23/843 |
| 2022/0132079 A1* | 4/2022 | Choi | H04N 25/78 |
| 2022/0329747 A1* | 10/2022 | Cho | G02B 3/0043 |
| 2022/0344399 A1* | 10/2022 | Ahn | H04N 25/704 |

FOREIGN PATENT DOCUMENTS

| | | |
|---|---|---|
| JP | 2006-340100 A | 12/2006 |
| JP | 4178250 B2 | 11/2008 |
| JP | 4334668 B2 | 9/2009 |
| JP | 5896603 B2 | 3/2016 |
| JP | 2016-163306 A | 9/2016 |

OTHER PUBLICATIONS

Solhusvik, J. et al., "A 1280x960 2.8?m HDR CIS with DCG and Split-Pixel Combined." https://api.semanticscholar.org/CorpusID:210115175.

European Search Report dated Nov. 7, 2022 for corresponding EP Patent Application No. 22176102.6.

* cited by examiner

IMAGE SENSOR HAVING A COLOR PIXEL GROUP CONFIGURED TO SENSE A COLOR DIFFERENT FROM RGB COLORS

CROSS-REFERENCE TO RELATED APPLICATIONS

This application is based on and claims priority under 35 U.S.C. § 119 to Korean Patent Application Nos. 10-2021-0070194, filed on May 31, 2021 and 10-2021-0107536, filed on Aug. 13, 2021, in the Korean Intellectual Property Office, the disclosures of which are incorporated by reference herein in their entirety.

BACKGROUND

The inventive concepts relate to image sensors.

Image sensors that capture images and convert images into electrical signals are used in electronic devices, such as digital cameras, mobile phone cameras, and portable camcorders, for general consumers and also used in cameras mounted on cars, security devices, and robots. Image sensors may include a pixel array, and each pixel of the pixel array may include a photodiode. Image sensors are required to perform an auto-focus (AF) function so that image capturing may be quickly and accurately performed.

SUMMARY

The inventive concepts provide image sensors for sensing various colors and performing auto-focus (AF) functions in vertical and horizontal directions.

According to an aspect of the inventive concepts, there is provided an image sensor including a plurality of red pixel groups each including a first red pixel and a second red pixel each configured to sense a red color, the first red pixel and the second red pixel being adjacent to each other in a first direction and sharing a single microlens with each other; a plurality of green pixel groups each including a first green pixel and a second green pixel each configured to sense a green color, the first green pixel and the second green pixel being adjacent to each other in the first direction and sharing a single microlens with each other; a plurality of blue pixel groups each including a first blue pixel and a second blue pixel each configured to sense a blue color, the first blue pixel and the second blue pixel being adjacent to each other in the first direction and sharing a single microlens with each other; and at least one color pixel group including a first color pixel and a second color pixel each configured to sense a certain color, the first color pixel and the second color pixel being adjacent to each other in a second direction and sharing a single microlens with each other, the first direction being perpendicular to the second direction; the certain color is different from the red color, the blue color, and the green color; and the at least one color pixel group is between the red pixel groups and the green pixel groups and between the green pixel groups and the blue pixel groups.

According to another aspect of the inventive concepts, there is provided an image sensor operating in a first color mode and a second color mode. The image sensor includes a first pixel group including a plurality of pixels each configured to sense one of a red color, a green color, and a blue color; and a second pixel group including a plurality of pixels each configured to sense one of a cyan color, a magenta color, and a yellow color, a number of pixels included in the first pixel group is greater than a number of pixels included in the second pixel group, and the image sensor is configured to generate RGB image data in the first color mode using pixel signals output from the first pixel group and generate CMY image data in the second color mode using pixel signals output from the second pixel group.

According to still another aspect of the inventive concepts, there is provided an image sensor including a plurality of red sharing pixel groups each including a plurality of red pixels configured to sense a red color and sharing a floating diffusion region with each other, a plurality of green sharing pixel groups each including a plurality of green pixels configured to sense a green color and sharing a floating diffusion region with each other, a plurality of blue sharing pixel groups each including a plurality of blue pixels configured to sense a blue color and sharing a floating diffusion region with each other, and a plurality of color pixel groups each including a plurality of color pixels configured to sense a certain color and sharing a floating diffusion region with each other, the certain color is different from the red color, the green color, and the blue color; a number of green pixels included in each of the plurality of green sharing pixel groups is greater than a number of red pixels included in each of the plurality of red sharing pixel groups; and the number of red pixels included in each of the plurality of red sharing pixel groups is greater than a number of color pixels included in each of the plurality of color pixel groups.

According to a further aspect of the inventive concepts, there is provided an image sensor including a plurality of red pixels configured to sense a red color, a plurality of green pixels configured to sense a green color, a plurality of blue pixels configured to sense a blue color, and a plurality of yellow pixels configured to sense a yellow color, wherein a ratio of numbers of red pixels, green pixels, blue pixels, and yellow pixels is 6:8:6:4.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments are described in detail with reference to the accompanying drawings.

Figure 1:
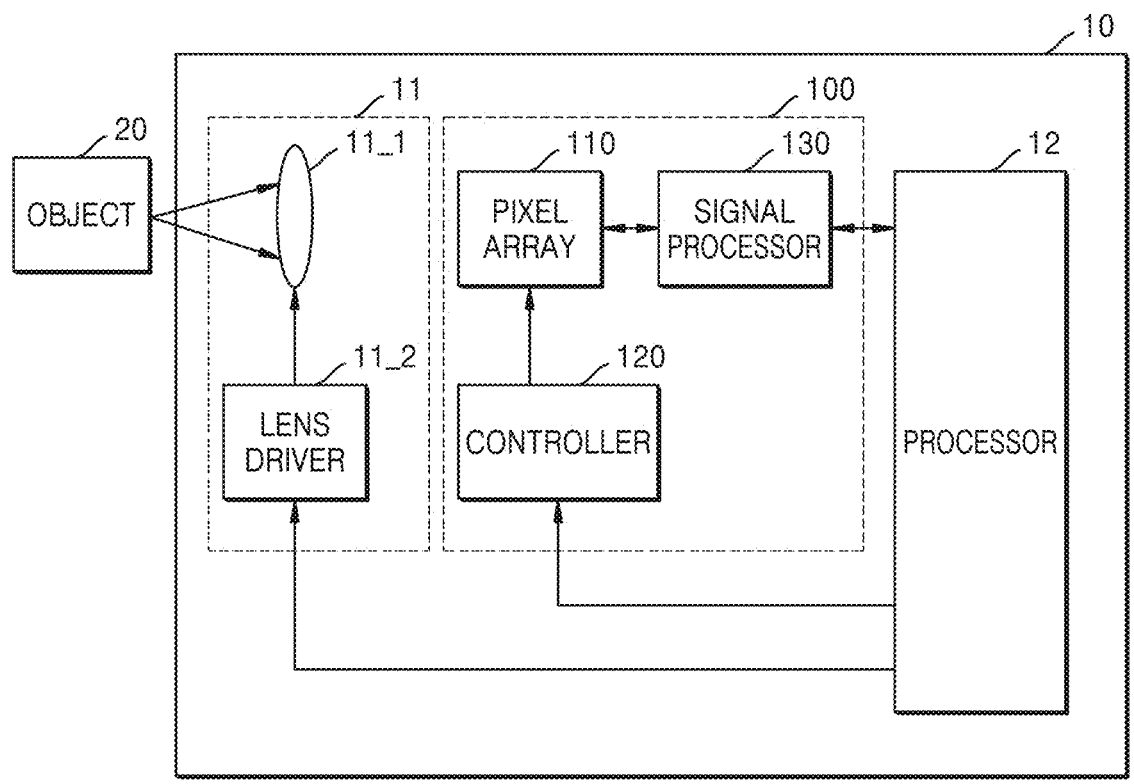
FIG. 1 is a diagram illustrating the structure of a digital imaging device, according to some example embodiments.

FIG. 1 is a diagram illustrating the structure of a digital imaging device 10, according to some example embodiments. FIG. 1 is provided to describe that the digital imaging device 10 performs an auto-focus (AF) function.

According to some example embodiments, the digital imaging device 10 may include an imaging unit 11, an image sensor 100, and a processor 12. The digital imaging device 10 may have a focusing function.

The general operations of the digital imaging device 10 may be controlled by the processor 12. The processor 12 may provide each of a lens driver 11_2 and a controller 120 with a control signal for an operation of each element.

The imaging unit 11 receives light and may include a lens 11_1 and the lens driver 11_2. The lens 11_1 may include a plurality of lenses. The imaging unit 11 may further include an aperture and an aperture driver.

The lens driver 11_2 may exchange information about focus detection with the processor 12 and may control the position of the lens 11_1 according to a control signal from the processor 12. The lens driver 11_2 may move the lens 11_1 in a direction away from or toward an object 20. Accordingly, the distance between the lens 11_1 and the object 20 may be controlled. The object 20 may be in focus or out of focus according to the position of the lens 11_1.

For example, when the distance between the lens 11_1 and the object 20 is relatively close to each other, the lens 11_1 may be displaced from an in-focus position with respect to the object 20, and there may be a phase difference between images captured by the image sensor 100. The lens driver 11_2 may move the lens 11_1 away from the object 20 based on a control signal provided by the processor 12.

When the distance between the lens 11_1 and the object 20 is relatively far away from each other, the lens 11_1 may be displaced from an in-focus position with respect to the object 20, and there may be a phase difference between images captured by the image sensor 100. The lens driver 11_2 may move the lens 11_1 toward the object 20 based on a control signal provided by the processor 12.

The image sensor 100 may convert (e.g., may be configured to convert) incident light into an image signal. The image sensor 100 may include a pixel array 110, the controller 120, and a signal processor 130. An optical signal that has passed through the lens 11_1 may form an image of the object 20 when the optical signal reaches a light-receiving surface of the pixel array 110.

The pixel array 110 may include a complementary metal-oxide semiconductor (CMOS) image sensor (CIS), which converts an optical signal into an electrical signal. The sensitivity or the like of the pixel array 110 may be controlled by the controller 120. The pixel array 110 may include a plurality of pixels that convert an optical signal into an electrical signal. Each of the pixels may generate a pixel signal according to the intensity of sensed light.

The image sensor 100 may provide image information to the processor 12, and the processor 12 may perform a phase difference calculation using the image information. For example, the processor 12 may receive image information, which corresponds to pixel signals generated by the pixels, from the signal processor 130 and perform a phase difference calculation, which may be obtained by performing a correlation operation on the image information. The processor 12 may obtain a position of a focus, a direction of the focus, a distance between the object 20 and the image sensor 100, or the like as a phase difference calculation result. The processor 12 may output (e.g., be configured to output) a control signal to the lens driver 11_2 to move the lens 11_1, based on the phase difference calculation result.

The processor 12 may reduce noise in an input signal and perform image signal processing, such as gamma correction, color filter array interpolation, color matrix, color correction, or color enhancement, for improving image quality. In addition, the processor 12 may generate an image file by compressing image data, which has resulted from image signal processing for improving image quality, or may restore the image data from the image file.

Figure 2:
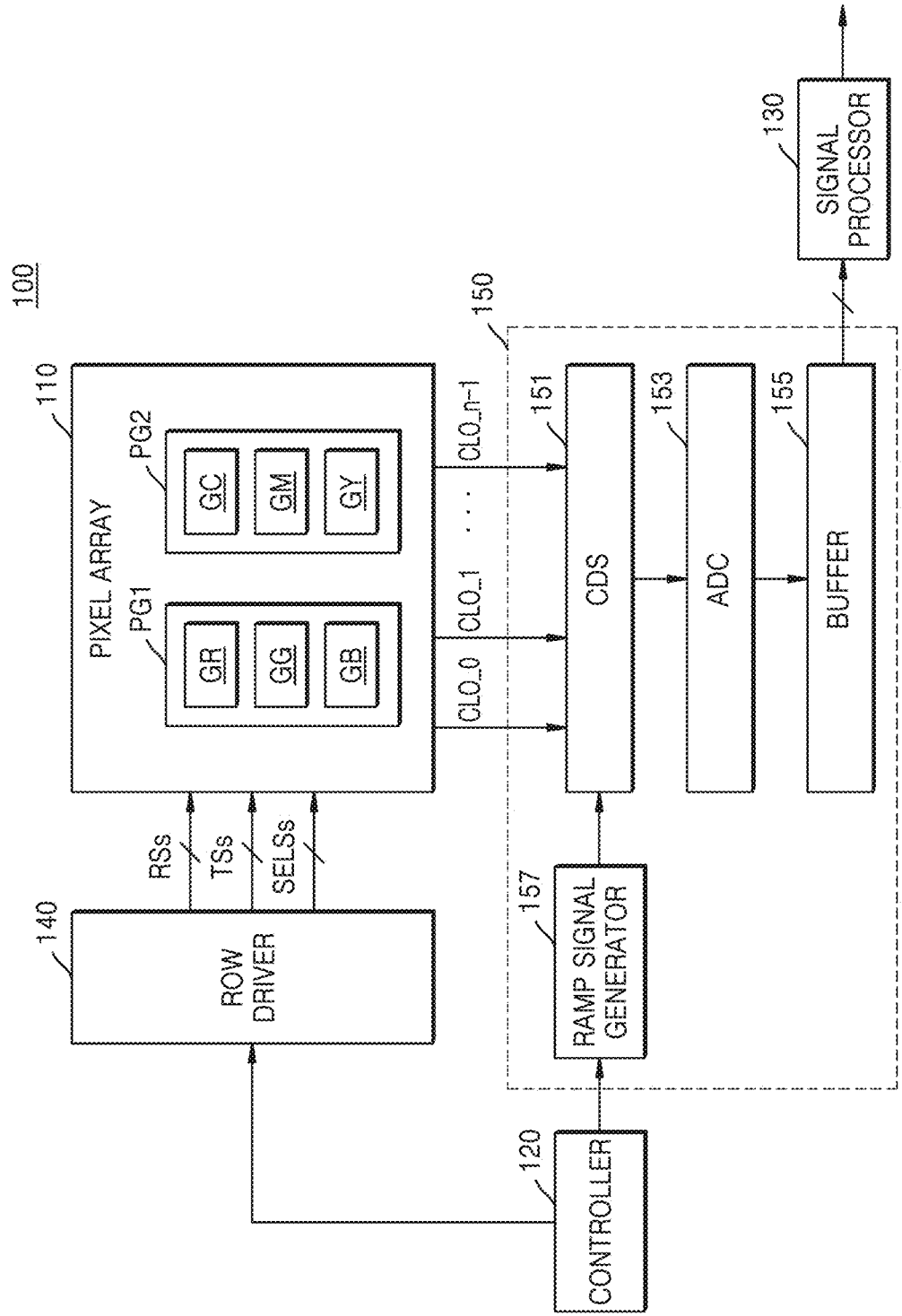
FIG. 2 is a block diagram illustrating the configuration of an image sensor, according to some example embodiments.

FIG. 2 is a block diagram illustrating the configuration of the image sensor 100, according to some example embodiments.

Referring to FIG. 2, the image sensor 100 may include the pixel array 110, the controller 120, the signal processor 130, a row driver 140, and a signal reader 150. The signal reader 150 may include a correlated double sampling circuit (CDS) 151, an analog-to-digital converter (ADC) 153, and a buffer 155. In some example embodiments, such as alternative to FIG. 2, the signal processor 130 may be included in a processor (e.g., the processor 12 in FIG. 1) outside the image sensor 100.

The pixel array 110 may include a plurality of pixels converting an optical signal into an electrical signal. Each of the pixels may generate a pixel signal according to the intensity of sensed light.

The pixel array 110 may include a first pixel group PG1 and a second pixel group PG2. The first pixel group PG1 may include pixels for sensing (e.g., the first pixel group PG1 may be configured to sense) colors in a different color space than the second pixel group PG2. According to a color mode, the image sensor 100 may output red-green-blue (RGB) image data using pixel signals generated by the first pixel group PG1 in a first color mode and output cyan-magenta-yellow (CMY) image data using pixel signals generated by the second pixel group PG2 in a second color mode. The image sensor 100 may output red-green-blue-cyan-magenta-yellow (RGBCMY) image data using the pixel signals generated by the first pixel group PG1 and the pixel signals generated by the second pixel group PG2 in a third color mode.

For example, the first pixel group PG1 may include a red pixel group GR including red pixels sensing (e.g., configured to sense) a red color, a green pixel group GG including green pixels sensing a green color, and a blue pixel group GB including blue pixels sensing a blue color. For example, the second pixel group PG2 may include a cyan pixel group GC including cyan pixels sensing a cyan color, a magenta pixel group GM including magenta pixels sensing a magenta color, and a yellow pixel group GY including yellow pixels sensing a yellow color. However, the second pixel group PG2 may include only the cyan pixel group GC and the yellow pixel group GY or include only a white pixel group sensing a white color. The above description is only exemplary, and the second pixel group PG2 is not limited thereto. In an example, the second pixel group PG2 may correspond to at least one color pixel group. The at least one color pixel group may include a first color pixel and a second color pixel. The first color pixel and the second color pixel are each configured to sense a certain color. For example, the certain color may be different from red, blue, and green. In a non-limiting example, the certain color may be, but is not limited to, one or more of cyan, magenta, yellow, and white.

According to color characteristics, the sensitivity of a pixel sensing a cyan, magenta, or yellow color may be higher than the sensitivity of a pixel sensing a red, green, or blue color. That is the sensitivity of a pixel sensing a cyan, magenta, or yellow color may be more able to sense a color than that of a pixel sensing a red, green, or blue color. In some example embodiments, each of the numbers of cyan pixels, magenta pixels, and yellow pixels of the pixel array 110 may be less than the number of red pixels (or blue or green pixels) of the pixel array 110.

The pixel array 110 may include a plurality of pixels that may perform an AF function or a distance measuring function. The pixels may generate a pixel signal for performing the AF function and a pixel signal for capturing an image. Accordingly, the image sensor 100 may generate AF data and image data.

Each pixel of the pixel array 110 may output a pixel signal to the CDS 151 through a corresponding one of first to n-th column output lines CLO_0 to CLO_n-1. In an AF mode, pixel signals output from respective pixels may correspond to phase signals used to calculate phase differences. The phase signals may include information about positions of images formed on the image sensor 100, and a focal position of a lens (e.g., the lens 11_1 in FIG. 1) may be calculated based on the calculated phase differences. For example, a position of the lens 11_1 that makes a phase difference zero may be the focal position.

The phase signals may be used to focus on an object (e.g., the object 20 in FIG. 1) and also be used to measure a distance between the object 20 and the image sensor 100. To measure the distance between the object 20 and the image sensor 100, additional information, such as phase differences between images formed on the image sensor 100, a distance between the lens 11_1 and the image sensor 100, the size of the lens 11_1, or the focal position of the lens 11_1, may also be referred to.

In some example embodiments, each of the red pixel group GR, the green pixel group GG, and the blue pixel group GB may include a first pixel and a second pixel, which are adjacent to each other in a first direction and share a microlens with each other. In some example embodiments, each of the cyan pixel group GC, the magenta pixel group GM, and the yellow pixel group GY may include a first pixel and a second pixel, which are adjacent to each other in a second direction that is perpendicular to the first direction and share a microlens with each other. Accordingly, the image sensor 100 may perform an AF function in the first direction (e.g., left and right directions or horizontal direction) using pixel signals generated by the first pixel group PG1 and perform an AF function in the second direction (e.g., up and down directions or vertical direction) using pixel signals generated by the second pixel group PG2. In some example embodiments, the at least one color pixel group may include first and second color pixels which are adjacent to each other in a second direction that is perpendicular to the first direction and share a microlens with each other.

The controller 120 may control the row driver 140 such that the pixel array 110 absorbs light, accumulates charges, temporarily stores the accumulated charges, and output an electrical signal corresponding to the stored charges. The controller 120 may also control the signal reader 150 to measure a level of a pixel signal provided by the pixel array 110.

The row driver 140 may generate signals, e.g., reset control signals RSs, transfer control signals TSs, and select signals SELSs, for controlling the pixel array 110 and provide the signals to a plurality of pixels. The row driver 140 may determine activation and deactivation timings of the reset control signals RSs, the transfer control signals TSs, and the select signals SELSs, which are provided to the pixels to perform an AF function or an image shooting function. The row driver 140 may also determine activation and deactivation timings of the reset control signals RSs, the transfer control signals TSs, and the select signals SELSs, which are provided to the pixels to perform a charge binning operation.

The CDS 151 may sample and hold a pixel signal provided by the pixel array 110. The CDS 151 may perform double sampling on a level of particular noise and a level of a pixel signal and output a level corresponding to the difference between samples levels. The CDS 151 may receive ramp signal from a ramp signal generator 157, compare the ramp signal with the pixel signal, and output a comparison result. The ADC 153 may convert an analog signal, which corresponds to a level received from the CDS 151, into a digital signal. The buffer 155 may latch the digital signal and sequentially output latched signals to the signal processor 130 or the outside of the image sensor 100.

The signal processor 130 may perform signal processing based on pixel signals received from a plurality of pixels. For example, the signal processor 130 may perform noise reduction, gain tuning, waveform shaping, interpolation, white balance, a gamma process, edge enhancement, or the like. In addition, the signal processor 130 may perform signal processing based on phase signals output from a plurality of pixels during an AF operation and output signal-processed information to the processor 12 such that the processor 12 performs a phase difference calculation for the AF operation.

The signal processor 130 may output RGB image data in the first color mode and output CMY image data in the second color mode. The image sensor 100 may output RGBCMY image data in the third color mode.

In some example embodiments, the signal processor 130 may receive red image information generated by a plurality of red pixel groups GR and yellow image information generated by a plurality of yellow pixel groups GY and generate processed red image information by summing up the red image information and weighted yellow image information. The signal processor 130 may receive blue image information generated by a plurality of blue pixel groups GB and cyan image information generated by a plurality of cyan pixel groups GC and generate processed blue image information by summing up the blue image information and weighted cyan image information. The signal processor 130 may receive green image information generated by a plurality of green pixel groups GG and magenta image information generated by a plurality of magenta pixel groups GM and generate processed green image information by summing up the green image information and weighted magenta image information.

Figure 3:
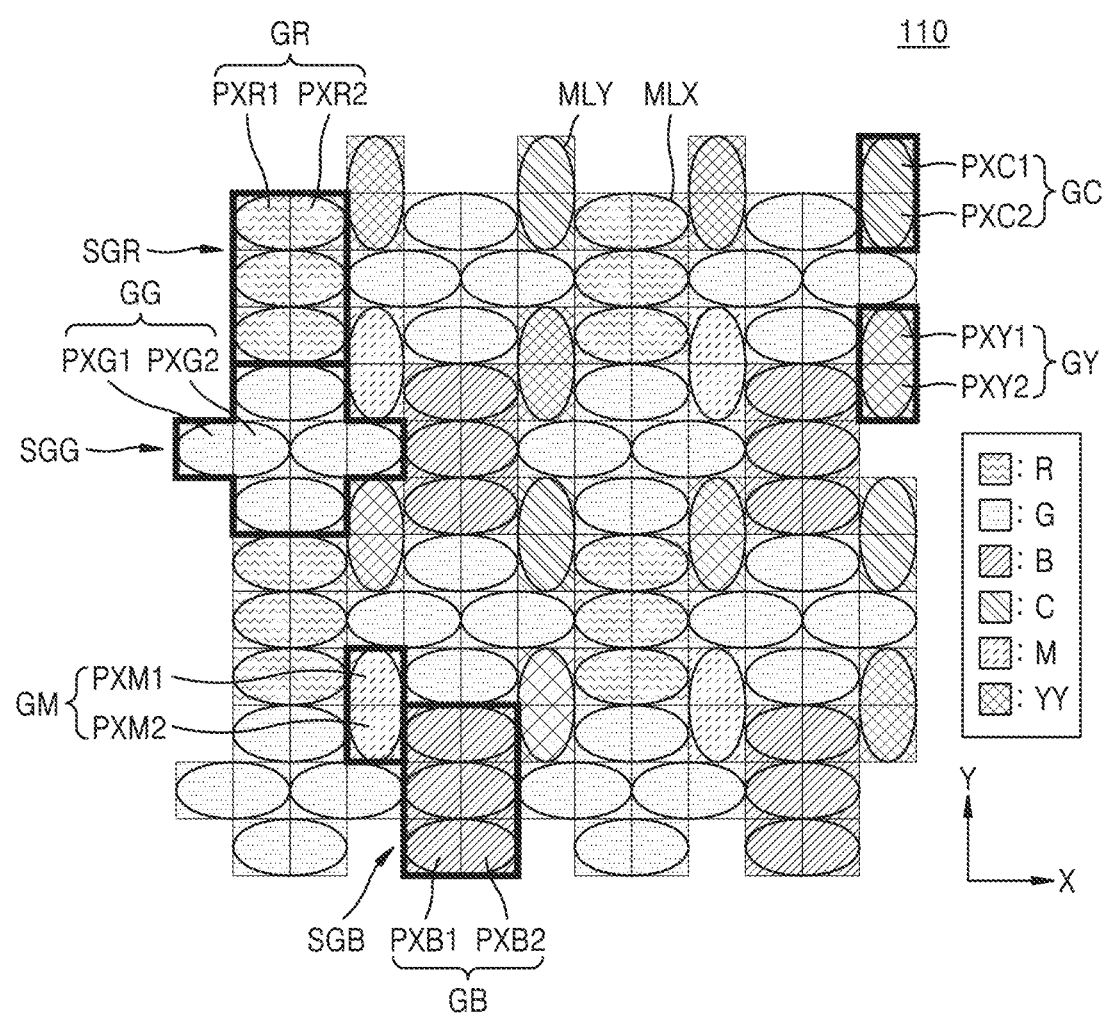
FIG. 3 is a diagram provided to describe a pixel array of an image sensor, according to some example embodiments.

FIG. 3 is a diagram provided to describe a pixel array of an image sensor, according to some example embodiments. FIG. 3 shows an example of a portion of the pixel array 110 in FIG. 2.

Referring to FIG. 3, the pixel array 110 may include a plurality of red pixel groups GR, a plurality of green pixel groups GG, a plurality of blue pixel groups GB, a plurality of cyan pixel groups GC, a plurality of magenta pixel groups GM, and a plurality of yellow pixel groups GY. A red color (R) filter may be provided for the red pixel groups GR, a green color (G) filter may be provided for the green pixel groups GG, a blue color (B) filter may be provided for the blue pixel groups GB, a cyan color (C) filter may be provided for the cyan pixel groups GC, a magenta color (M) filter may be provided for the magenta pixel groups GM, and a yellow color (YY) filter may be provided for the yellow pixel groups GY.

A red pixel group GR may include red pixels, e.g., a first red pixel PXR1 and a second red pixel PXR2, which are adjacent to each other in a first direction X. A single microlens MLX may be provided above the first and second red pixels PXR1 and PXR2. In other words, the first red pixel PXR1 and the second red pixel PXR2 may share the microlens MLX with each other. A green pixel group GG may include green pixels, e.g., a first green pixel PXG1 and a second green pixel PXG2, which are adjacent to each other in the first direction X and share a microlens MLX with each other. A blue pixel group GB may include blue pixels, e.g., a first blue pixel PXB1 and a second blue pixel PXB2, which are adjacent to each other in the first direction X and share a microlens MLX with each other.

According to the shape and refractive index of the microlens MLX, the amount of charges generated by each of the first red pixel PXR1 and the second red pixel PXR2 may be different, the amount of charges generated by each of the first green pixel PXG1 and the second green pixel PXG2 may be different, and the amount of charges generated by each of the first blue pixel PXB1 and the second blue pixel PXB2 may be different. Accordingly, the AF function in the first direction X may be performed based on first pixel signals respectively output from the first red pixel PXR1, the first green pixel PXG1, and the first blue pixel PXB1 and second pixel signals respectively output from the second red pixel PXR2, the second green pixel PXG2, and the second blue pixel PXB2.

A cyan pixel group GC may include cyan pixels, e.g., a first cyan pixel PXC1 and a second cyan pixel PXC2, which are adjacent to each other in a second direction Y and share a microlens MLY with each other. A magenta pixel group GM may include magenta pixels, e.g., a first magenta pixel PXM1 and a second magenta pixel PXM2, which are adjacent to each other in the second direction Y and share a microlens MLY with each other. A yellow pixel group GY may include yellow pixels, e.g., a first yellow pixel PXY1 and a second yellow pixel PXY2, which are adjacent to each other in the second direction Y and share a microlens MLY with each other.

According to the shape and refractive index of the microlens MLY, the amount of charges generated by each of the first cyan pixel PXC1 and the second cyan pixel PXC2 may be different, the amount of charges generated by each of the first magenta pixel PXM1 and the second magenta pixel PXM2 may be different, and the amount of charges generated by each of the first yellow pixel PXY1 and the second yellow pixel PXY2 may be different. Accordingly, the AF function in the second direction Y may be performed based on first pixel signals respectively output from the first cyan pixel PXC1, the first magenta pixel PXM1, and the first yellow pixel PXY1 and second pixel signals respectively output from the second cyan pixel PXC2, the second magenta pixel PXM2, and the second yellow pixel PXY2.

In some example embodiments, the number of green pixels included in each green shared pixel group SGG is greater than the number of red pixels included in each red shared pixel group SGR. In some example embodiments, the number of red pixels included in each red shared pixel group SGR is greater than the number of color pixels included in each of at least one color pixel group.

A red sharing pixel group SGR may include three red pixel groups GR, which are consecutively arranged in the second direction Y. In other words, the red sharing pixel group SGR may include a total of six red pixels adjacent to each other by two in each of first to third consecutive rows. In some example embodiments, the red pixels of the red sharing pixel group SGR may share a floating diffusion region with one another and may be connected to one column output line. In some example embodiments, the red shared pixel group SGR and one of the at least one color pixel group may share a floating diffusion region with each other.

A green sharing pixel group SGG may include four green pixel groups GG, which are arranged in consecutive first to third rows. Two green pixel groups GG arranged in the second row may be adjacent to each other in the first direction X and may be adjacent to both the green pixel group GG of the first row and the green pixel group GG of the third row. In other words, the green sharing pixel group SGG may include a total of eight green pixels adjacent to each other by two, four, and two in each of first to third consecutive rows. In some example embodiments, the green pixels of the green sharing pixel group SGG may share a floating diffusion region with one another and may be connected to one column output line.

A blue sharing pixel group SGB may include three blue pixel groups GB, which are consecutively arranged in the second direction Y. In other words, the blue sharing pixel group SGB may include a total of six blue pixels adjacent to each other by two in each of first to third consecutive rows. In some example embodiments, the blue pixels of the blue sharing pixel group SGB may share a floating diffusion region with one another and may be connected to one column output line.

The red sharing pixel group SGR, the green sharing pixel group SGG, and the blue sharing pixel group SGB may have a Bayer pattern. The image sensor 100 in FIG. 2 may generate Bayer image data using pixel signals output from the red sharing pixel group SGR, pixel signals output from the green sharing pixel group SGG, and pixel signals output from the blue sharing pixel group SGB.

Each of the red sharing pixel group SGR, the green sharing pixel group SGG, and the blue sharing pixel group SGB may adjacent to the cyan pixel group GC, the magenta pixel group GM, and the yellow pixel group GY. Each of the cyan pixel group GC, the magenta pixel group GM, and the yellow pixel group GY may be adjacent to the red sharing pixel group SGR, the green sharing pixel group SGG, and the blue sharing pixel group SGB. Each of the cyan pixel group GC, the magenta pixel group GM, and the yellow pixel group GY may be between the red sharing pixel group SGR and the green sharing pixel group SGG and between the green sharing pixel group SGG and the blue sharing pixel group SGB.

Each of the numbers of cyan pixels, magenta pixels, and yellow pixels of the pixel array 110 may be less than the number of red, blue, or green pixels of the pixel array 110. In some example embodiments, the ratio of the numbers of red pixels, green pixels, blue pixels, cyan pixels, magenta pixels, and yellow pixels in the pixel array 110 may be 6:8:6:2:4:2. According to color characteristics, the sensitivity of a pixel sensing C, M, or YY may be higher than the sensitivity of a pixel sensing R, G, or B. Accordingly, although there are relatively small numbers of cyan pixels, magenta pixels, and yellow pixels, the CMY sensitivity of the image sensor 100 may not be decreased compared to the RGB sensitivity of the image sensor 100.

Because the image sensor 100 may sense CMY colors as well as RGB colors, the color sensitivity of the image sensor 100 may be enhanced. In addition, the image sensor 100 may provide both the AF function in the first direction X and the AF function in the second direction Y.

Figure 4A:
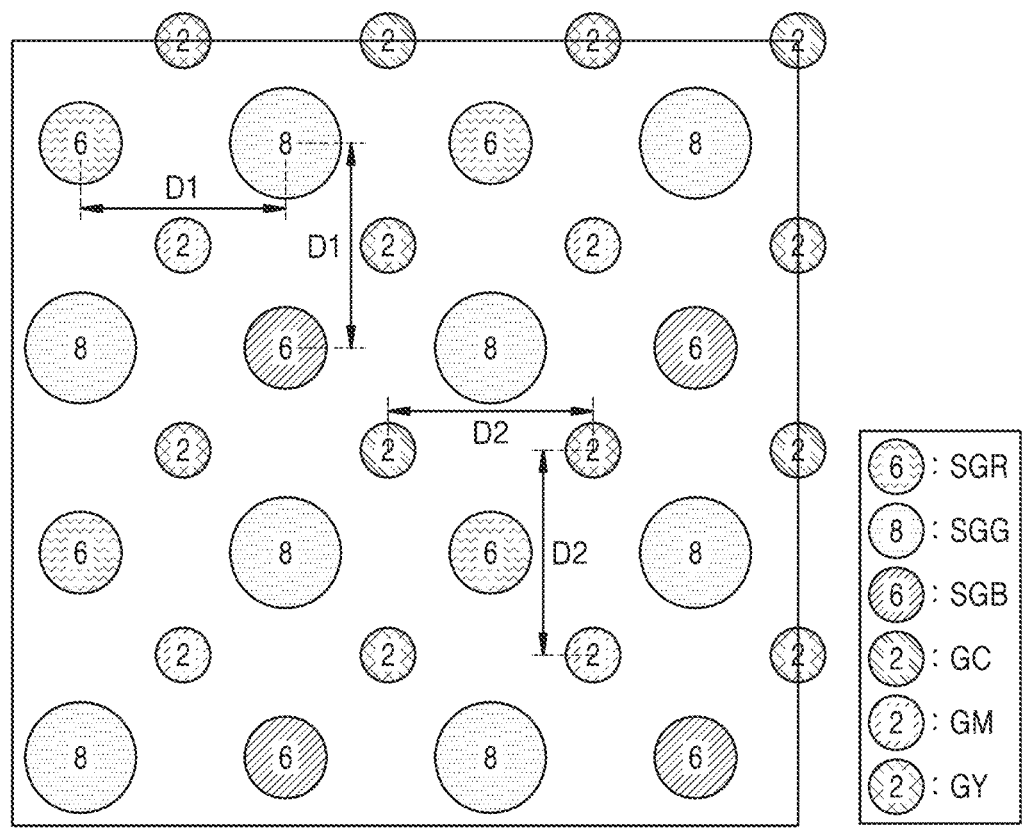
FIGS. 4A and 4B are diagrams provided to describe operations of an image sensor in different color modes, according to some example embodiments.
Figure 4B:
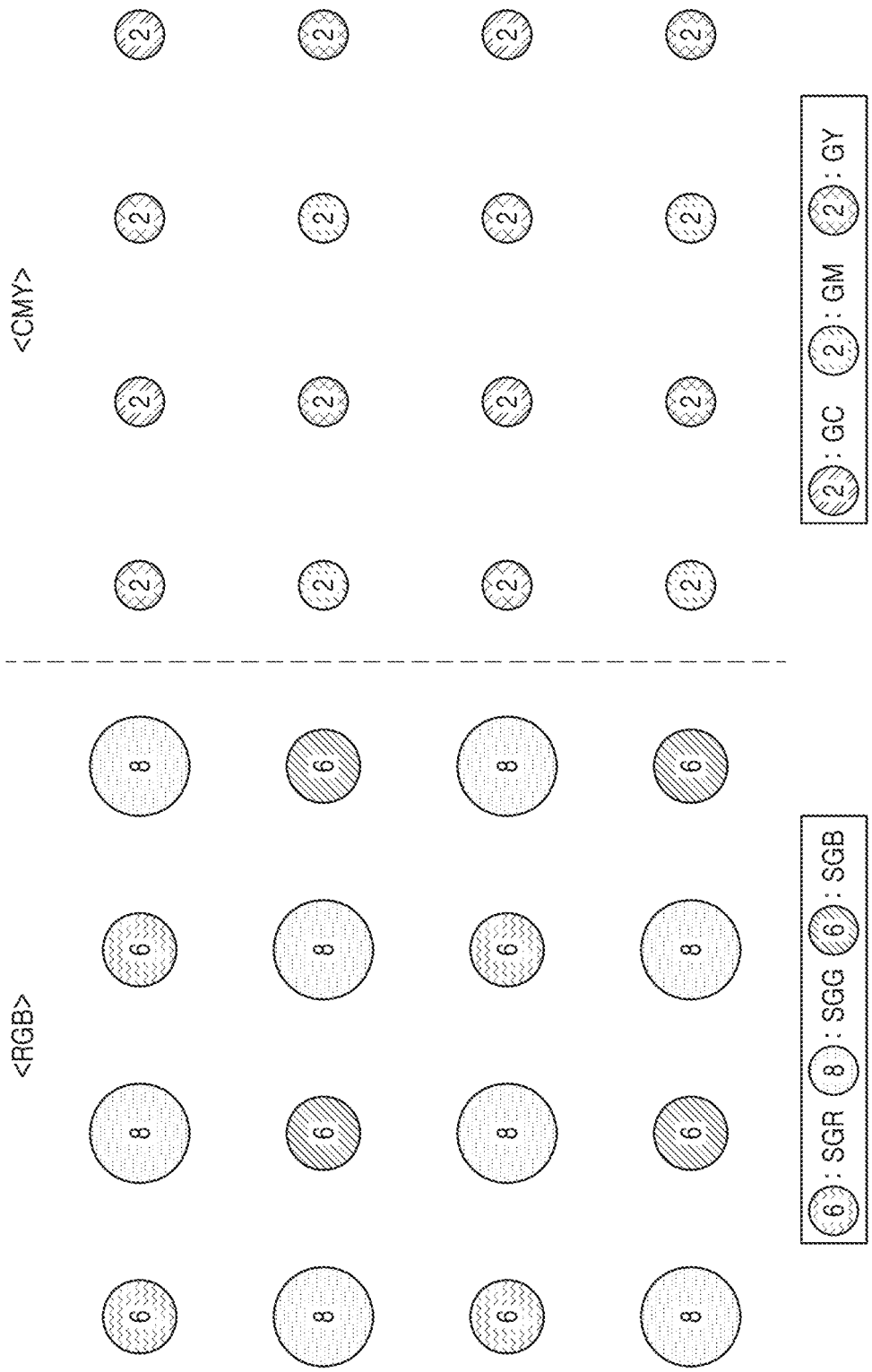

FIGS. 4A and 4B are diagrams provided to describe operations of an image sensor in different color modes, according to some example embodiments. FIGS. 4A and 4B are provided to describe the operations of the image sensor 100 including the pixel array 110 of FIG. 3.

Referring to FIG. 4A, the image sensor 100 in FIG. 1 may drive the red sharing pixel group SGR like a single pixel by simultaneously accumulating (i.e., performing binning on) photocharges generated by six red pixels of the red sharing pixel group SGR. Similarly, the image sensor 100 may drive the green sharing pixel group SGG like a single pixel by simultaneously accumulating photocharges generated by eight green pixels of the green sharing pixel group SGG and drive the blue sharing pixel group SGB like a single pixel by simultaneously accumulating photocharges generated by six blue pixels of the blue sharing pixel group SGB. Accordingly, the image sensor 100 may substantially increase the full well capacity (FWC) of a pixel.

The red sharing pixel group SGR, the green sharing pixel group SGG, and the blue sharing pixel group SGB may be repeatedly arranged to be separated from each other by a first distance D1. In some example embodiments, red sharing pixel groups SGR, green sharing pixel groups SGG, and blue sharing pixel groups SGB may be arranged to have a Bayer pattern. In other words, a distance from the center of a red sharing pixel group SGR to the center of a green sharing pixel group SGG closest to the red sharing pixel group SGR may be the first distance D1, and a distance from the center of a blue sharing pixel group SGB to the center of a green sharing pixel group SGG closest to the blue sharing pixel group SGB may also be the first distance D1.

The image sensor 100 may drive the cyan pixel group GC like a single pixel by simultaneously accumulating photocharges generated by two cyan pixels of the cyan pixel group GC. Similarly, the image sensor 100 may drive the magenta pixel group GM like a single pixel by simultaneously accumulating photocharges generated by two magenta pixels of the magenta pixel group GM and drive the yellow pixel group GY like a single pixel by simultaneously accumulating photocharges generated by two yellow pixels of the yellow pixel group GY.

The cyan pixel group GC, the magenta pixel group GM, and the yellow pixel group GY may be repeatedly arranged to be separated from each other by a second distance D2. In some example embodiments, cyan pixel groups GC, magenta pixel groups GM, and yellow pixel groups GY may be arranged in a pattern, in which a cyan pixel group GC may be at a position of a red color in the Bayer pattern, a magenta pixel group GM may be at a position of a blue color in the Bayer pattern, and a yellow pixel group GY may be at a position of a green color in the Bayer pattern. In other words, a distance from the center of a cyan pixel group GC to the center of a yellow pixel group GY closest to the cyan pixel group GC may be the second distance D2, and a distance from the center of a magenta pixel group GM to the center of a yellow pixel group GY closest to the magenta pixel group GM may also be the second distance D2. In some example embodiments, the first distance D1 may be the same as the second distance D2, but embodiments are not limited thereto. The first distance D1 may be different from the second distance D2 according to the shape of a pixel.

Referring to FIG. 4B, the image sensor 100 in FIG. 1 may generate RGB image data in the first color mode using pixel signals, which are generated by red sharing pixel groups SGR, green sharing pixel groups SGG, and blue sharing pixel groups SGB. The signal processor 130 (in FIG. 2) or the processor 12 (in FIG. 1) of the image sensor 100 may generate red image data, green image data, and blue image data from the RGB image data through a demosaicing operation.

The image sensor 100 may generate CMY image data in the second color mode using pixel signals, which are generated by cyan pixel groups GC, magenta pixel groups GM, and yellow pixel groups GY. The signal processor 130 or the processor 12 of the image sensor 100 may generate cyan image data, magenta image data, and yellow image data or red image data, green image data, and blue image data from the CMY image data through a demosaicing operation.

The image sensor 100 may generate RGBCMY image data in the third color mode by using pixel signals, which are generated by the red sharing pixel groups SGR, the green sharing pixel groups SGG, the blue sharing pixel groups SGB, the cyan pixel groups GC, the magenta pixel groups GM, and the yellow pixel groups GY.

In some example embodiments, the image sensor 100 may drive pixels, which sense different colors, like a single pixel by performing charge binning on the pixels. For example, the image sensor 100 may drive ten (or eight) pixels like a single pixel by simultaneously accumulating photocharges generated by six red pixels of a red sharing pixel group SGR and photocharges generated by four (or two) yellow pixels of at most two yellow pixel groups GY. For example, the image sensor 100 may drive eight pixels like a single pixel by simultaneously accumulating photocharges generated by six blue pixels of a blue sharing pixel group SGB and photocharges generated by two cyan pixels of a cyan pixel group GC. For example, the image sensor 100 may drive ten pixels like a single pixel by simultaneously accumulating photocharges generated by eight green pixels of a green sharing pixel group SGG and photocharges generated by two magenta pixels of a magenta pixel group GM.

Because the image sensor 100 may sense CMY colors as well as RGB colors and generate RGB image data or CMY image data according to a color mode, the color sensitivity of the image sensor 100 may be enhanced.

Figure 5A:
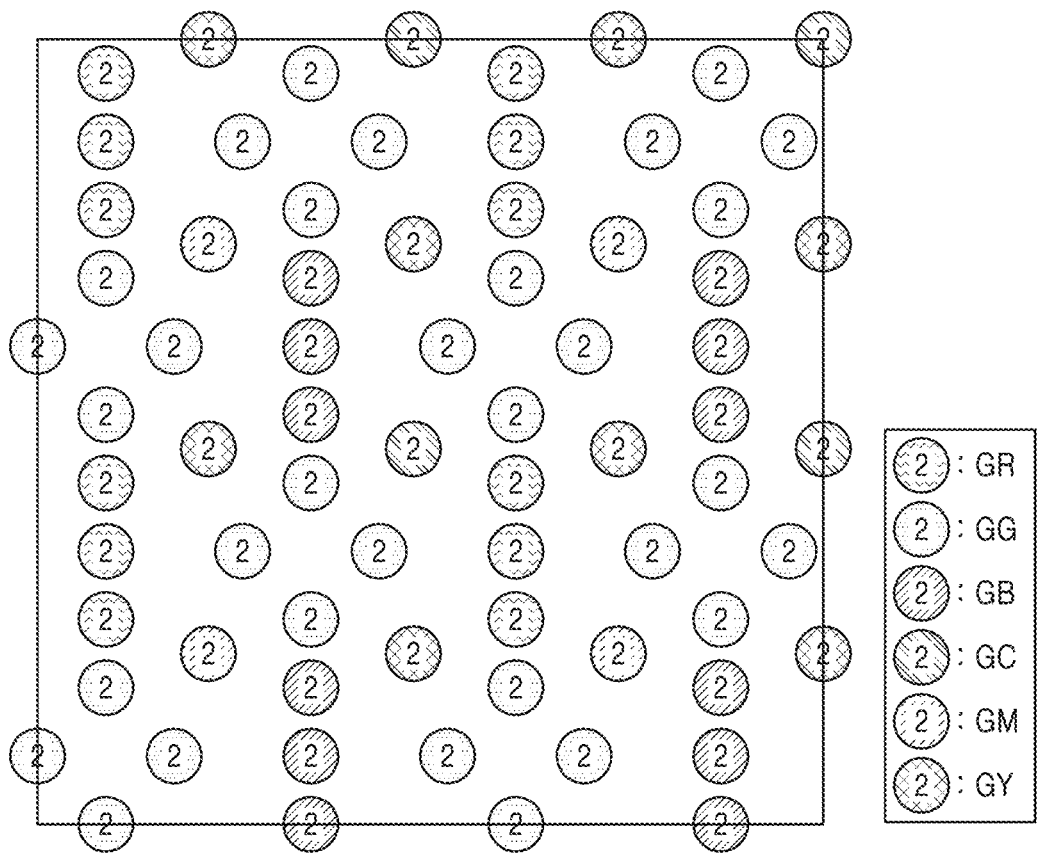
FIGS. 5A and 5B are diagrams provided to describe operations of an image sensor in different color modes, according to some example embodiments.
Figure 5B:
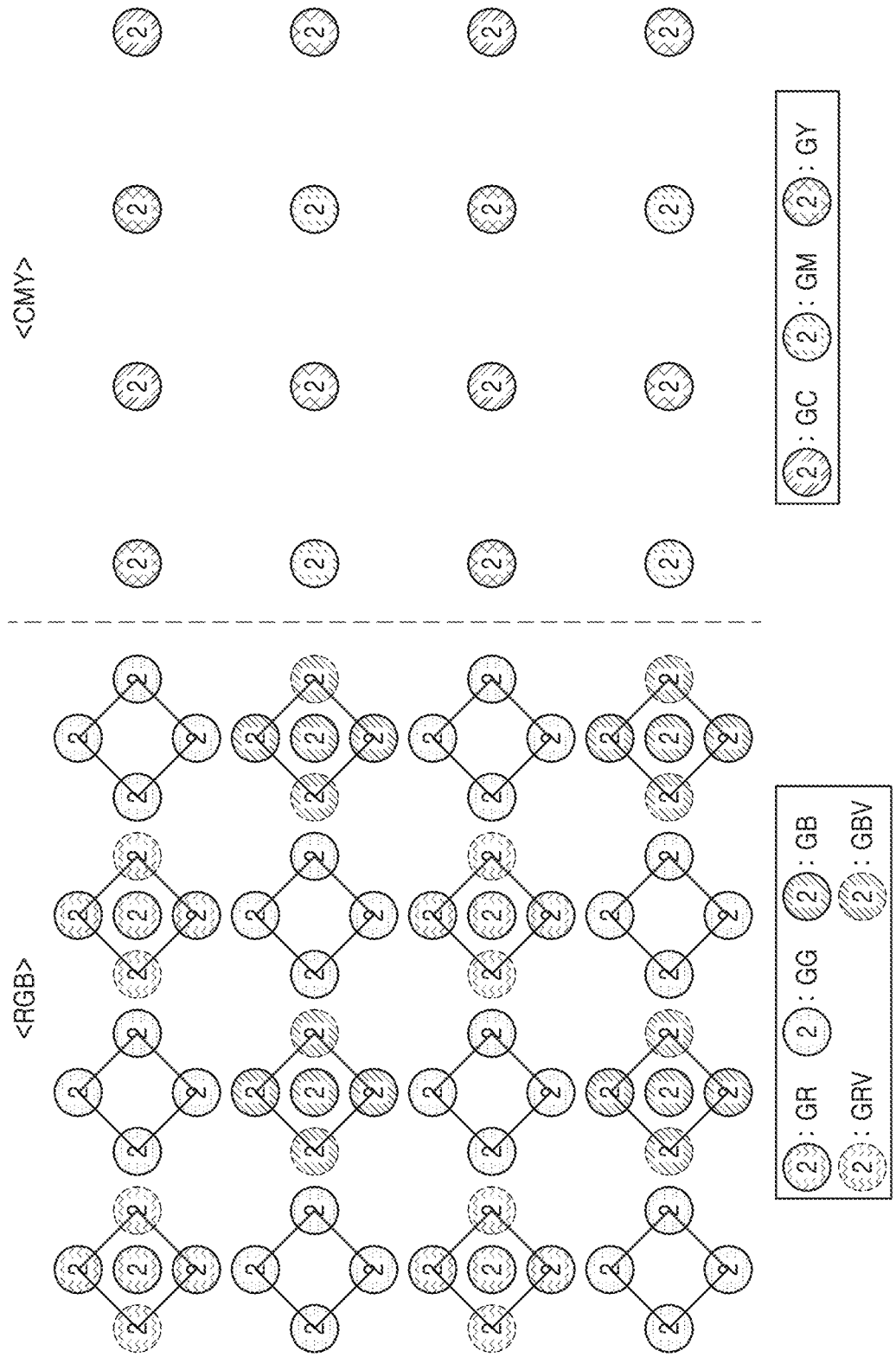

FIGS. 5A and 5B are diagrams provided to describe operations of an image sensor in different color modes, according to some example embodiments. FIGS. 5A and 5B are provided to describe the operations of the image sensor 100 including the pixel array 110 of FIG. 3.

Referring to FIG. 5A, the image sensor 100 in FIG. 1 may drive a red pixel group GR like a single pixel by simultaneously accumulating (i.e., performing binning on) photocharges generated by two red pixels of the red pixel group GR. Similarly, the image sensor 100 may drive a green pixel group GG like a single pixel by simultaneously accumulating photocharges generated by two green pixels of the green pixel group GG and drive a blue pixel group GB like a single pixel by simultaneously accumulating photocharges generated by two blue pixels of the blue pixel group GB.

The image sensor 100 may drive a cyan pixel group GC like a single pixel by simultaneously accumulating photocharges generated by two cyan pixels of the cyan pixel group GC. Similarly, the image sensor 100 may drive a magenta pixel group GM like a single pixel by simultaneously accumulating photocharges generated by two magenta pixels of the magenta pixel group GM and drive a yellow pixel group GY like a single pixel by simultaneously accumulating photocharges generated by two yellow pixels of the yellow pixel group GY.

Referring to FIG. 5B, it may be assumed that virtual red pixel groups GRV and virtual blue pixel groups GBV are formed by adjusting the positions of some of red pixel groups GR and some of blue pixel groups GB and that pixel signals are output from the virtual red pixel groups GRV and the virtual blue pixel groups GBV. For example, it may be assumed that pixel signals are output from the virtual red pixel groups GRV by adjusting the position of a red pixel group GR in the middle among three red pixel groups GR, which are consecutively arranged in the second direction Y (in FIG. 3), in the first direction X (in FIG. 3) and a reverse direction of the first direction X.

Accordingly, the red pixel groups GR, the virtual red pixel groups GRV, green pixel groups GG, the blue pixel groups GB, and the virtual blue pixel groups GBV may be arranged in a tetra pattern. In other words, four pixel groups sensing one color may be repeatedly arranged in a diamond shape.

The image sensor 100 (in FIG. 1) may generate RGB image data in the first color mode using pixel signals, which are generated by red pixel groups GR, green pixel groups GG, and blue pixel groups GB. The processor 12 (in FIG. 1) or the signal processor 130 (in FIG. 2) may generate a red color image, a green color image, and a blue color image by performing a remosaic process on the RGB image data having a diamond-shaped tetra pattern. For example, the image sensor 100 may generate the RGB data described above with reference to FIG. 4B to increase sensitivity or the RGB data described with reference to FIG. 5B to increase resolution, according to illuminance.

The image sensor 100 may generate CMY image data in the second color mode using pixel signals, which are generated by cyan pixel groups GC, magenta pixel groups GM, and yellow pixel groups GY. The image sensor 100 may generate RGBCMY image data in the third color mode using pixel signals, which are generated by the red pixel groups GR, the green pixel groups GG, the blue pixel groups GB, the cyan pixel groups GC, the magenta pixel groups GM, and the yellow pixel groups GY. Because the image sensor 100 may sense CMY colors as well as RGB colors and generate RGB image data or CMY image data according to a color mode, the color sensitivity of the image sensor 100 may be enhanced.

Figure 6:
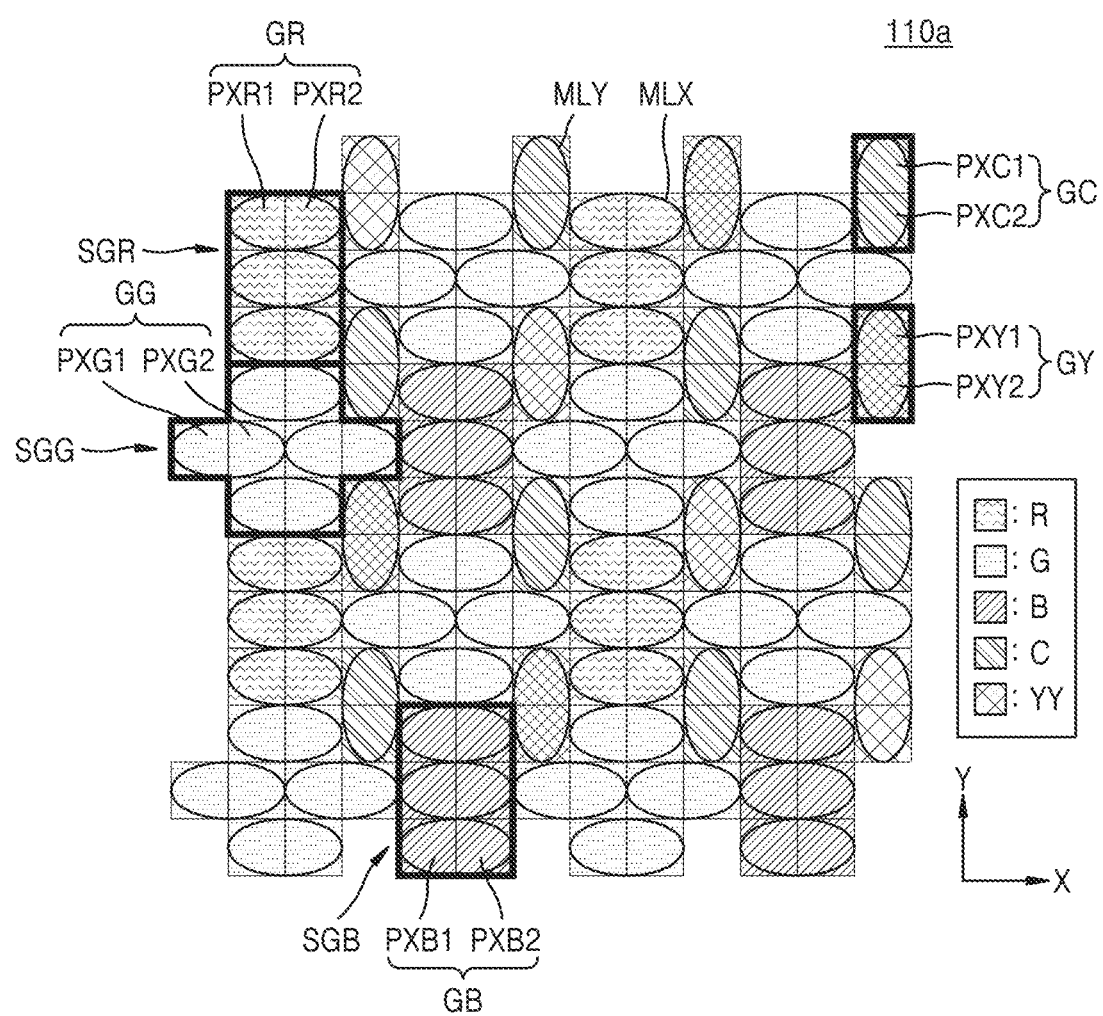
FIGS. 6 and 7 are diagrams provided to describe pixel arrays of an image sensor, according to example embodiments.
Figure 7:
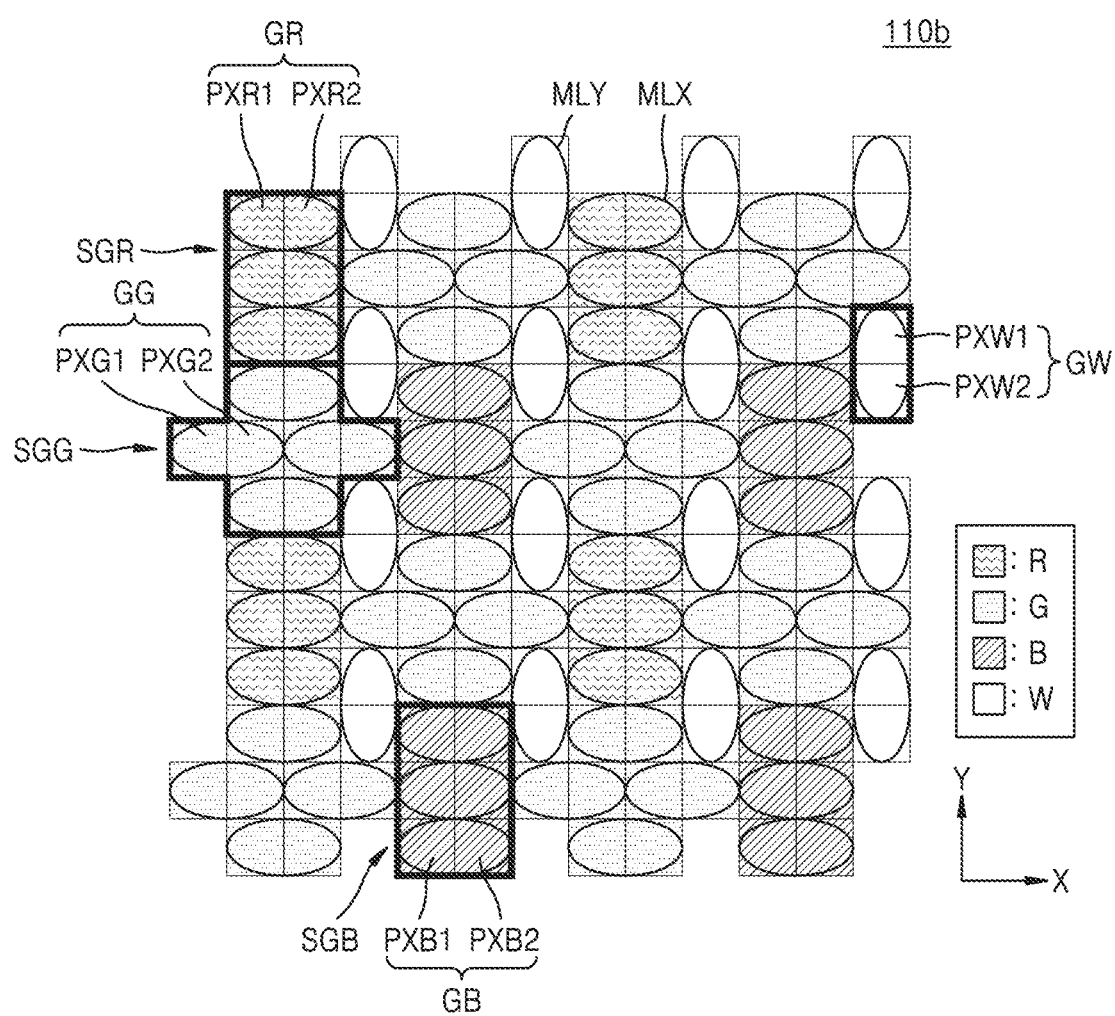

FIGS. 6 and 7 are diagrams provided to describe pixel arrays of an image sensor, according to example embodiments, and show different examples of the pixel array 110 of FIG. 3. Redundant descriptions of like reference characters in FIGS. 3, 6, and 7 are omitted.

Referring to FIG. 6, a pixel array 110a may include a plurality of red pixel groups GR, a plurality of green pixel groups GG, a plurality of blue pixel groups GB, a plurality of cyan pixel groups GC, and a plurality of yellow pixel groups GY. In some example embodiments, the ratio of the number of red pixels, green pixels, blue pixels, cyan pixels, and yellow pixels may be 6:8:6:4:4. Compared to the pixel array 110 of FIG. 3, the pixel array 110a may have cyan pixel groups GC at positions of the magenta pixel groups GM of the pixel array 110 of FIG. 3. However, the pixel array 110a is not limited to the pixel array 110a in FIG. 6. In some example embodiments, the pixel array 110a may include a plurality of red pixel groups GR, a plurality of green pixel groups GG, a plurality of blue pixel groups GB, and a plurality of yellow pixel groups GY, wherein the ratio of the number of red pixels, green pixels, blue pixels, and yellow pixels may be 6:8:6:4.

Referring to FIG. 7, a pixel array 110b may include a plurality of red pixel groups GR, a plurality of green pixel groups GG, a plurality of blue pixel groups GB, and a plurality of white pixel groups GW.

A white pixel group GW may include white pixels, e.g., a first white pixel PXW1 and a second white pixel PXW2, which are adjacent to each other in the second direction Y and share a microlens MLY with each other. Compared to the pixel array 110 of FIG. 3, the pixel array 110b may have the white pixel groups GW at positions of cyan pixel groups GC, magenta pixel groups GM, and yellow pixel groups GY of the pixel array 110 of FIG. 3. Accordingly, the pixel array 110b includes the white pixel groups GW performing the AF function in the second direction Y, thereby increasing the AF function of an image sensor in the second direction Y.

Figure 8:
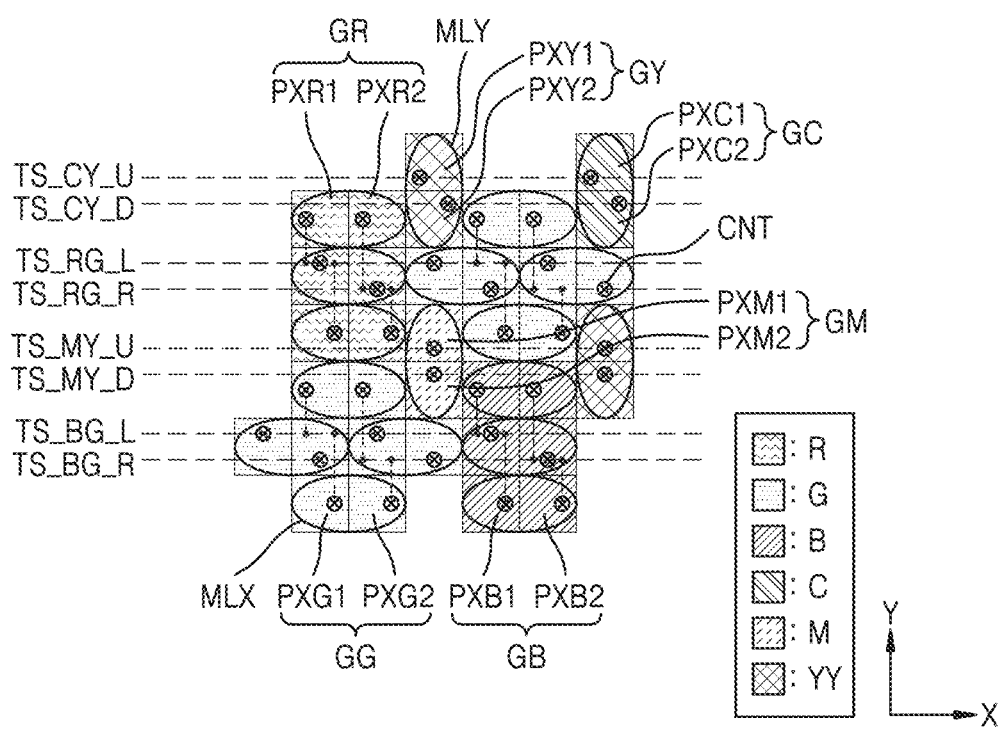
FIG. 8 is a diagram provided to describe transfer control signals provided to pixels of an image sensor, according to some example embodiments.

FIG. 8 is a diagram provided to describe transfer control signals provided to pixels of an image sensor, according to some example embodiments. FIG. 8 is provided to describe transfer control signals provided to the pixel array 110 of FIG. 3. In FIG. 8, a connector CNT in a pixel may indicate that a particular transfer control signal is provided to the pixel through the connector CNT. The transfer control signals described with reference to FIG. 8 may be included in the transfer control signals TSs in FIG. 2.

Referring to FIGS. 3 and 8, a yellow pixel group GY and a cyan pixel group GC, which are in line in the first direction X, may receive the same transfer control signals. For example, the first yellow pixel PXY1 of the yellow pixel group GY and the first cyan pixel PXC1 of the cyan pixel group GC may receive a first transfer control signal TS_CY_U, and the second yellow pixel PXY2 of the yellow pixel group GY and the second cyan pixel PXC2 of the cyan pixel group GC may receive a second transfer control signal TS_CY_D. When the first transfer control signal TS_CY_U is activated, first pixel signals may be output according to photocharges generated by the first yellow pixel PXY1 and the first cyan pixel PXC1. When the second transfer control signal TS_CY_D is activated, second pixel signals may be output according to photocharges generated by the second yellow pixel PXY2 and the second cyan pixel PXC2. Accordingly, the image sensor 100 of FIG. 2 may perform the AF function in the second direction Y using the first pixel signals and the second pixel signals.

A red pixel group GR and a green pixel group GG, which are in line in the first direction X, may receive the same transfer control signals. When a red sharing pixel group SGR and a green sharing pixel group SGG are in line in the first direction X, red pixel groups GR of the red sharing pixel group SGR and green pixel groups GG of the green sharing pixel group SGG may receive the same transfer control signals.

For example, first red pixels PXR1 of the red sharing pixel group SGR and first green pixels PXG1 of the green sharing pixel group SGG may receive a third transfer control signal TS_RG_L, and second red pixels PXR2 of the red sharing pixel group SGR and second green pixels PXG2 of the green sharing pixel group SGG may receive a fourth transfer control signal TS_RG_R. When the third transfer control signal TS_RG_L is activated, first pixel signals may be output according to photocharges generated by the first red pixels PXR1 and the first green pixels PXG1. When the fourth transfer control signal TS_RG_R is activated, second pixel signals may be output according to photocharges generated by the second red pixels PXR2 and the second green pixels PXG2. Accordingly, the image sensor 100 may perform the AF function in the first direction X using the first pixel signals and the second pixel signals.

A magenta pixel group GM and a yellow pixel group GY, which are in line in the first direction X, may receive the same transfer control signals. For example, the first magenta pixel PXM1 of the magenta pixel group GM and the first yellow pixel PXY1 of the yellow pixel group GY may receive a fifth transfer control signal TS_MY_U, and the second magenta pixel PXM2 of the magenta pixel group GM and the second yellow pixel PXY2 of the yellow pixel group GY may receive a sixth transfer control signal TS_MY_D. When the fifth transfer control signal TS_MY_U is activated, first pixel signals may be output according to photocharges generated by the first magenta pixel PXM1 and the first yellow pixel PXY1. When the sixth transfer control signal TS_MY_D is activated, second pixel signals may be output according to photocharges generated by the second magenta pixel PXM2 and the second yellow pixel PXY2. Accordingly, the image sensor 100 may perform the AF function in the second direction Y using the first pixel signals and the second pixel signals.

A green pixel group GG and a blue pixel group GB, which are in line in the first direction X, may receive the same transfer control signals. When a green sharing pixel group SGG and a blue sharing pixel group SGB are in line in the first direction X, green pixel groups GG of the green sharing pixel group SGG and blue pixel groups GB of the blue sharing pixel group SGB may receive the same transfer control signals.

For example, first blue pixels PXB1 of the blue sharing pixel group SGB and first green pixels PXG1 of the green sharing pixel group SGG may receive a seventh transfer control signal TS_BG_L, and second blue pixels PXB2 of the blue sharing pixel group SGB and second green pixels PXG2 of the green sharing pixel group SGG may receive an eighth transfer control signal TS_BG_R. When the seventh transfer control signal TS_BG_L is activated, first pixel signals may be output according to photocharges generated by the first blue pixels PXB1 and the first green pixels PXG1. When the eighth transfer control signal TS_BG_R is activated, second pixel signals may be output according to photocharges generated by the second blue pixels PXB2 and the second green pixels PXG2. Accordingly, the image sensor 100 may perform the AF function in the first direction X using the first pixel signals and the second pixel signals. However, the transfer control signals provided to the pixel array in FIG. 8 are just examples, and the image sensor 100 is not limited to FIG. 8.

Figure 9:
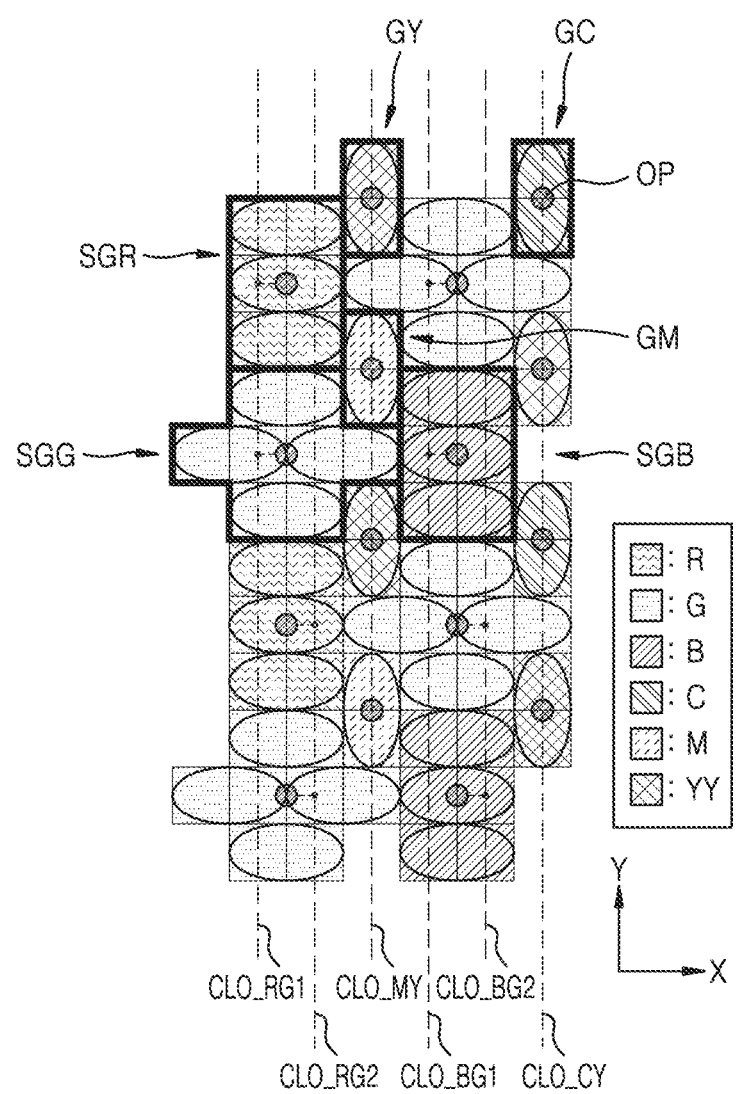
FIG. 9 is a diagram provided to describe column output lines connected to pixels of an image sensor, according to some example embodiments.

FIG. 9 is a diagram provided to describe column output lines connected to pixels of an image sensor, according to some example embodiments. FIG. 9 is provided to describe column output lines connected to the pixel array 110 of FIG. 3. In FIG. 9, an output node OP in a pixel group or a sharing pixel group may indicate that the pixel group or the sharing pixel group is connected to a column output line through the output node OP. The column output lines described with reference to FIG. 9 may be included in the first to n-th column output lines CLO_0 to CLO_n−1 in FIG. 2.

Referring to FIGS. 3 and 9, red sharing pixel groups SGR and green sharing pixel groups SGG, which are in line in the second direction Y, may be connected to either a first column output line CLO_RG1 or a second column output line CLO_RG2. For example, a red sharing pixel group SGR and a green sharing pixel group SGG, which are adjacent to each other in the second direction Y, may be connected to the first column output line CLO_RG1; and another red sharing pixel group SGR and another green sharing pixel group SGG, which are adjacent to each other in the second direction Y, may be connected to the second column output line CLO_RG2. This connection pattern may be repeated in the second direction Y.

Green sharing pixel groups SGG and blue sharing pixel groups SGB, which are in line in the second direction Y, may be connected to either a third column output line CLO_BG1 or a fourth column output line CLO_BG2. For example, a green sharing pixel group SGG and a blue sharing pixel group SGB, which are adjacent to each other in the second direction Y, may be connected to the third column output line CLO_BG1; and another green sharing pixel group SGG and another blue sharing pixel group SGB, which are adjacent to each other in the second direction Y, may be connected to the fourth column output line CLO_BG2. This connection pattern may be repeated in the second direction Y.

Yellow pixel groups GY and magenta pixel groups GM, which are in line in the second direction Y, may be connected to the same column output line, e.g., a column output line CLO_MY. Cyan pixel groups GC and yellow pixel groups GY, which are in line in the second direction Y, may be connected to the same column output line, e.g., a column output line CLO_CY.

In the image sensor 100 (of FIG. 2) according to some example embodiments, column output lines connected to pixels sensing RGB colors may be separate from column output lines connected to pixels sensing CMY colors. Accordingly, the image sensor 100 may simultaneously sense the RGB colors and the CMY colors. However, the connection relationship between a pixel array and column output lines in FIG. 9 is just an example, and the image sensor 100 is not limited to FIG. 9. Among the column output lines connected to pixels sensing the RGB colors and the column output lines connected to pixels sensing the CMY colors, at least some column output lines may be used in common.

Figure 10:
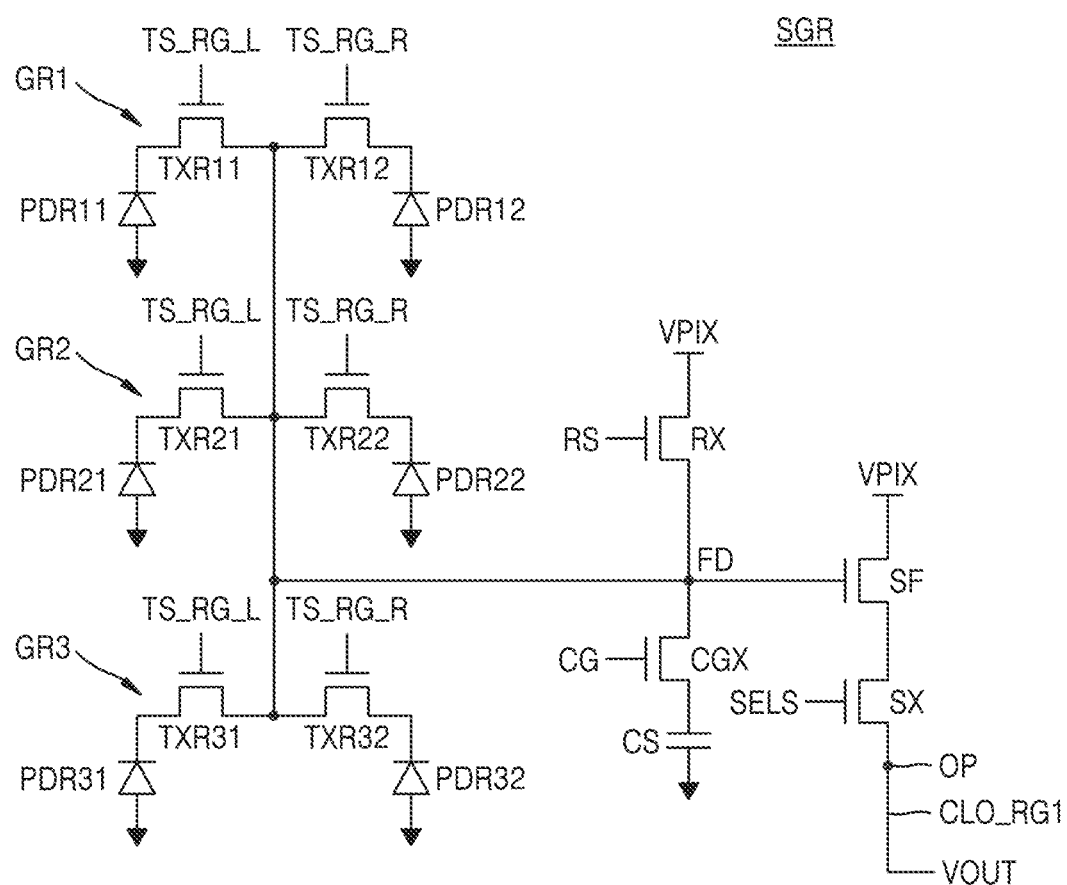
FIG. 10 is an example circuit diagram of a red sharing pixel group in FIG. 3.

FIG. 10 is an example circuit diagram of a red sharing pixel group SGR in FIG. 3. Descriptions of the red sharing pixel group SGR, which are given with reference to FIG. 10, may also be applied to a green sharing pixel group SGG, a blue sharing pixel group SGB, a cyan pixel group GC, a magenta pixel group GM, and a yellow pixel group GY in FIG. 3.

Referring to FIG. 10, a first red pixel PXR1 of a first red pixel group GR1 in the first row of the red sharing pixel groups SGR may include a first photodiode PDR11 and a first transfer transistor TXR11, and a second red pixel PXR2 of the first red pixel group GR1 may include a second photodiode PDR12 and a second transfer transistor TXR12.

A first red pixel PXR1 of a second red pixel group GR2 in the second row of the red sharing pixel groups SGR may include a first photodiode PDR21 and a first transfer transistor TXR21, and a second red pixel PXR2 of the second red pixel group GR2 may include a second photodiode PDR22 and a second transfer transistor TXR22.

A first red pixel PXR1 of a third red pixel group GR3 in the third row of the red sharing pixel groups SGR may include a first photodiode PDR31 and a first transfer transistor TXR31, and a second red pixel PXR2 of the third red pixel group GR3 may include a second photodiode PDR32 and a second transfer transistor TXR32.

Each of the first photodiodes PDR11, PDR21, and PDR31 and the second photodiodes PDR12, PDR22, and PDR32 may generate photocharge that varies with the intensity of light. For example, as a P-N junction diode, each of the first photodiodes PDR11, PDR21, and PDR31 and the second photodiodes PDR12, PDR22, and PDR32 may generate charges, i.e., electrons corresponding to negative charges and holes corresponding to positive charges, in proportion to the amount of incident light. Each of the first photodiodes PDR11, PDR21, and PDR31 and the second photodiodes PDR12, PDR22, and PDR32 is an example of a photoelectric conversion element and may include at least one selected from a phototransistor, a photogate, a pinned photodiode (PPD), and a combination thereof.

Each of the first transfer transistors TXR11, TXR21, and TXR31 and the second transfer transistors TXR12, TXR22, and TXR32 may be turned on in response to a corresponding one of transfer control signals, e.g., the third transfer control signal TS_RG_L and the fourth transfer control signal TS_RG_R described above with reference to FIG. 8. Each of the first transfer transistors TXR11, TXR21, and TXR31 and the second transfer transistors TXR12, TXR22, and TXR32 may transfer photocharge from a corresponding photodiode to a floating diffusion region FD, and photocharges may be accumulated and stored in the floating diffusion region FD. That is, the floating diffusion region FD may be configured to accumulate photocharges.

The red sharing pixel group SGR may include a select transistor SX, a source follower SF, a reset transistor RX, a conversion gain transistor CGX, and a capacitor CS. In some example embodiments, such as alternative to FIG. 10, at least one selected from the select transistor SX, the source follower SF, the reset transistor RX, the conversion gain transistor CGX, and the capacitor CS may be omitted.

The first red pixels PXR1 and the second red pixels PXR2 of the red sharing pixel group SGR may share the floating diffusion region FD, the select transistor SX, the source follower SF, the reset transistor RX, the conversion gain transistor CGX, and the capacitor CS with one another.

The reset transistor RX may periodically reset charges that have been accumulated in the floating diffusion region FD. A source electrode of the reset transistor RX may be connected to the floating diffusion region FD, and a drain electrode of the reset transistor RX may be connected to a power supply voltage VPIX. When the reset transistor RX is turned on in response to a reset control signal RS, the power supply voltage VPIX connected to the drain electrode of the reset transistor RX may be applied to the floating diffusion region FD. When the reset transistor RX is turned on, charges accumulated in the floating diffusion region FD may be discharged so that the floating diffusion region FD may be reset.

A first terminal of the conversion gain transistor CGX may be connected to the floating diffusion region FD, and a second terminal of the conversion gain transistor CGX may be connected to the capacitor CS. When the conversion gain transistor CGX is turned on in response to a conversion gain control signal CG, the capacitor CS is connected to the floating diffusion region FD, and accordingly, the equivalent capacitance of the floating diffusion region FD may be increased. The FWC of the red sharing pixel group SGR may be increased. In some example embodiments, alternative to FIG. 10, the conversion gain transistor CGX may be connected to the floating diffusion region FD and the reset transistor RX, and a terminal of the capacitor CS may be connected to a node, to which the conversion gain transistor CGX and the reset transistor RX are connected. In other words, the conversion gain transistor CGX and the reset transistor RX may be connected in series to the floating diffusion region FD.

In some example embodiments, the image sensor 100 (of FIG. 2) may support dual conversion gain (DCG) by operating in a low conversion gain (LCG) mode and a high conversion gain (HCG) mode. In the LCG mode, the conversion gain control signal CG may be at a high level to accumulate photocharge in the floating diffusion region FD and the capacitor CS. Accordingly, the equivalent capacitance of the floating diffusion region FD may be substantially increased, and conversion gain may be decreased.

Contrarily, in the HCG mode, the conversion gain control signal CG may be at a low level. Accordingly, the equivalent capacitance of the floating diffusion region FD may be relatively decreased, and the conversion gain may be increased. Accordingly, the image sensor 100 may operate both in the LCG mode and the HCG mode with respect to a single frame and may extend a dynamic range.

The source follower SF may be controlled according to the amount of photocharges accumulated in the floating diffusion region FD. The source follower SF, as a buffer amplifier, may buffer a signal corresponding to the charges of the floating diffusion region FD. The source follower SF may amplify a potential variation in the floating diffusion region FD and output an amplification result as a pixel signal VOUT to a column output line, e.g., the first column output line CLO_RG1 in FIG. 9.

A drain terminal of the select transistor SX may be connected to a source terminal of the source follower SF, and a source terminal of the select transistor SX may be connected to an output node OP. The select transistor SX may output the pixel signal VOUT to the CDS 151 (in FIG. 2) through the first column output line CLO_RG1 in response to a select signal SELS.

Figure 11:
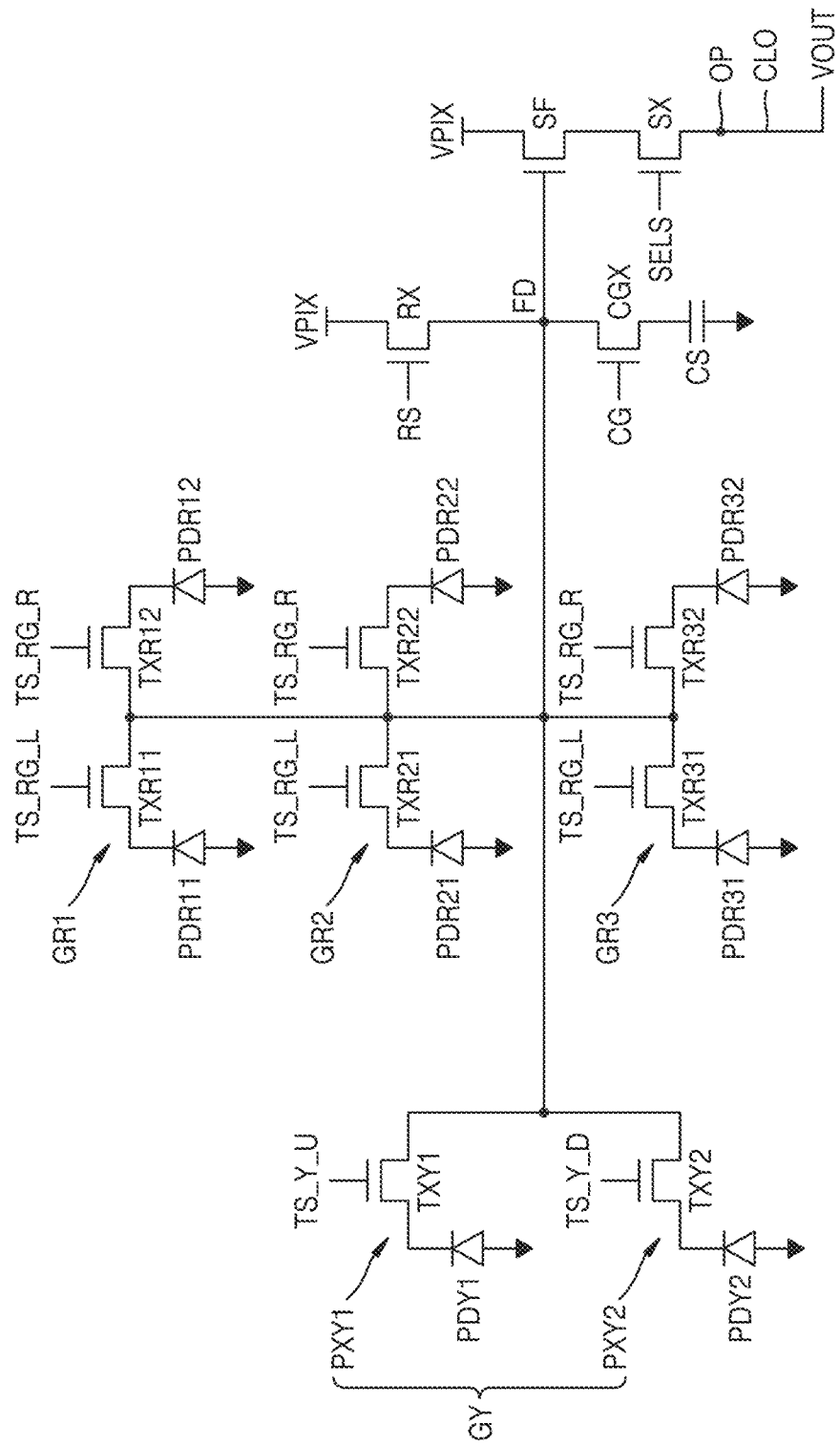
FIG. 11 is an example circuit diagram of a red sharing pixel group and a yellow pixel group in FIG. 3.
Figure 12:
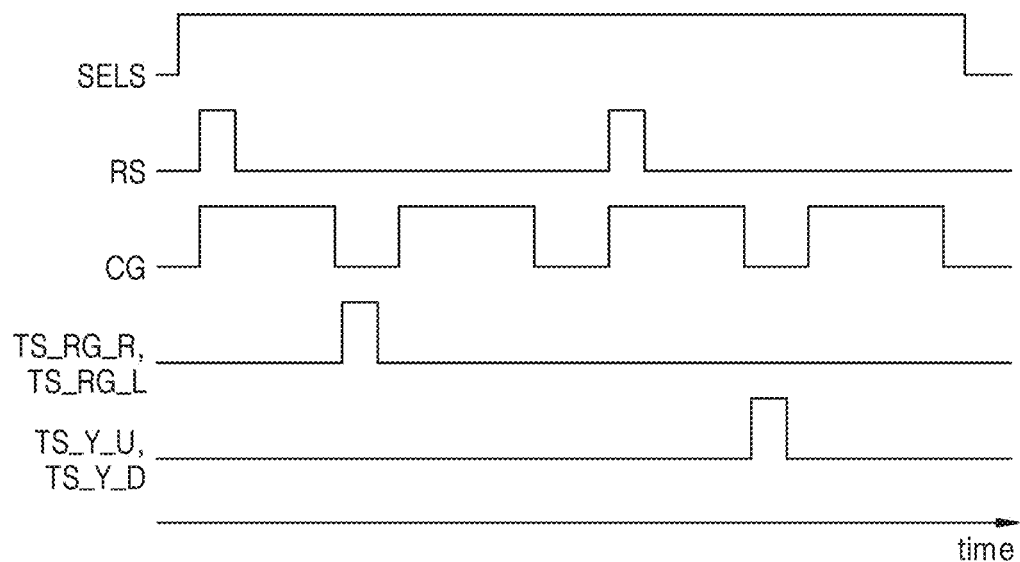
FIG. 12 is a timing diagram of control signals provided to the red sharing pixel group and the yellow pixel group in FIG. 11.

FIG. 11 is an example circuit diagram of a red sharing pixel group SGR and a yellow pixel group GY in FIG. 3. FIG. 12 is a timing diagram of control signals provided to the red sharing pixel group SGR and the yellow pixel group GY in FIG. 11. Descriptions of the red sharing pixel group SGR and the yellow pixel group GY, which are given with reference to FIG. 11, may also be applied to a blue sharing pixel group SGB, a cyan pixel group GC, a green sharing pixel group SGG, and a magenta pixel group GM in FIG. 3. Redundant descriptions of like reference characters in FIGS. 10 and 11 are omitted.

Referring to FIG. 11, a first yellow pixel PXY1 of the yellow pixel group GY may include a first photodiode PDY1 and a first transfer transistor TXY1, and a second yellow pixel PXY2 of the yellow pixel group GY may include a second photodiode PDY2 and a second transfer transistor TXY2.

The first transfer transistor TXY1 may be turned on in response to a first transfer control signal TS_Y_U, and the second transfer transistor TXY2 may be turned on in response to the second transfer control signal TS_Y_D. The first transfer control signal TS_Y_U may correspond to the first transfer control signal TS_CY_U or the fifth transfer control signal TS_MY_U in FIG. 8. The second transfer control signal TS_Y_D may correspond to the second transfer control signal TS_CY_D or the sixth transfer control signal TS_MY_D in FIG. 8. Each of the first transfer transistor TXY1 and the second transfer transistor TXY2 may transfer photocharge from a corresponding photodiode to the floating diffusion region FD, and photocharges may be accumulated and stored in the floating diffusion region FD.

The yellow pixel group CY and the red sharing pixel group SGR may share the floating diffusion region FD, the select transistor SX, the source follower SF, the reset transistor RX, the conversion gain transistor CGX, and the capacitor CS with each other. The yellow pixel group CY and the red sharing pixel group SGR may output the pixel signal VOUT to a column output line CLO, e.g., one of the first to n-th column output lines CLO_0 to CLO_n−1 in FIG. 2.

Referring to FIGS. 11 and 12, the select signal SELS may transit from a low level to a high level with respect to a single frame and remain at the high level during a certain period. As the reset control signal RS and the conversion gain control signal CG transit from the low level to the high level, a reset operation may be performed to reset the photocharges stored in the floating diffusion region FD and the capacitor CS.

When the reset operation is completed, the conversion gain control signal CG may transit from the high level to the low level. As the third and fourth transfer control signals TS_RG_L and TS_RG_R transit from the low level to the high level in a state in which the conversion gain control signal CG is at the low level, the pixel signal VOUT generated by the red sharing pixel group SGR in the HCG mode may be output to the column output line CLO. Thereafter, the conversion gain control signal CG may transit from the low level to the high level, and the pixel signal VOUT generated by the red sharing pixel group SGR in the LCG mode may be output to the column output line CLO. Accordingly, the image sensor 100 (of FIG. 2) may operate in both the HCG mode and the LCG mode to sense a red color in a single frame and thus extend a dynamic range.

Thereafter, as the reset control signal RS and the conversion gain control signal CG transit from the low level to the high level, another reset operation may be performed to reset photocharges stored in the floating diffusion region FD and the capacitor CS.

When the reset operation is completed, the conversion gain control signal CG may transit from the high level to the low level. As the first and second transfer control signals TS_Y_U and TS_Y_D transit from the low level to the high level in a state in which the conversion gain control signal CG is at the low level, the pixel signal VOUT generated by the yellow pixel group GY in the HCG mode may be output to the column output line CLO. Thereafter, the conversion gain control signal CG may transit from the low level to the high level, and the pixel signal VOUT generated by the yellow pixel group GY in the LCG mode may be output to the column output line CLO. Accordingly, the image sensor may operate in both the HCG mode and the LCG mode to sense a yellow color in a single frame and thus extend a dynamic range.

However, FIG. 12 is the timing diagram of control signals when the image sensor 100 does not perform an AF function, and the timing diagram of control signals may be different from the one of FIG. 12 when the image sensor 100 performs an AF function. For example, when the image sensor 100 performs an AF function, the first and second transfer control signals TS_Y_U and TS_CY_D may not simultaneously but sequentially transit from the low level to the high level. For example, when the image sensor 100 performs an AF function, the third and fourth transfer control signals TS_RG_L and TS_RG_R may not simultaneously but sequentially transit from the low level to the high level. In other words, to perform the AF function in the second direction Y, the image sensor 100 may separately read a pixel signal corresponding to the first yellow pixel PXY1 of the yellow pixel group GY and a pixel signal corresponding to the second yellow pixel PXY2 of the yellow pixel group GY. To perform the AF function in the first direction X, the image sensor 100 may separately read a pixel signal corresponding to first red pixels (e.g., pixels to which the third transfer control signal TS_RG_L is provided) of the red sharing pixel group SGR and a pixel signal corresponding to second red pixels (e.g., pixels to which the fourth transfer control signal TS_RG_R is provided) of the red sharing pixel group SGR.

Figure 13:
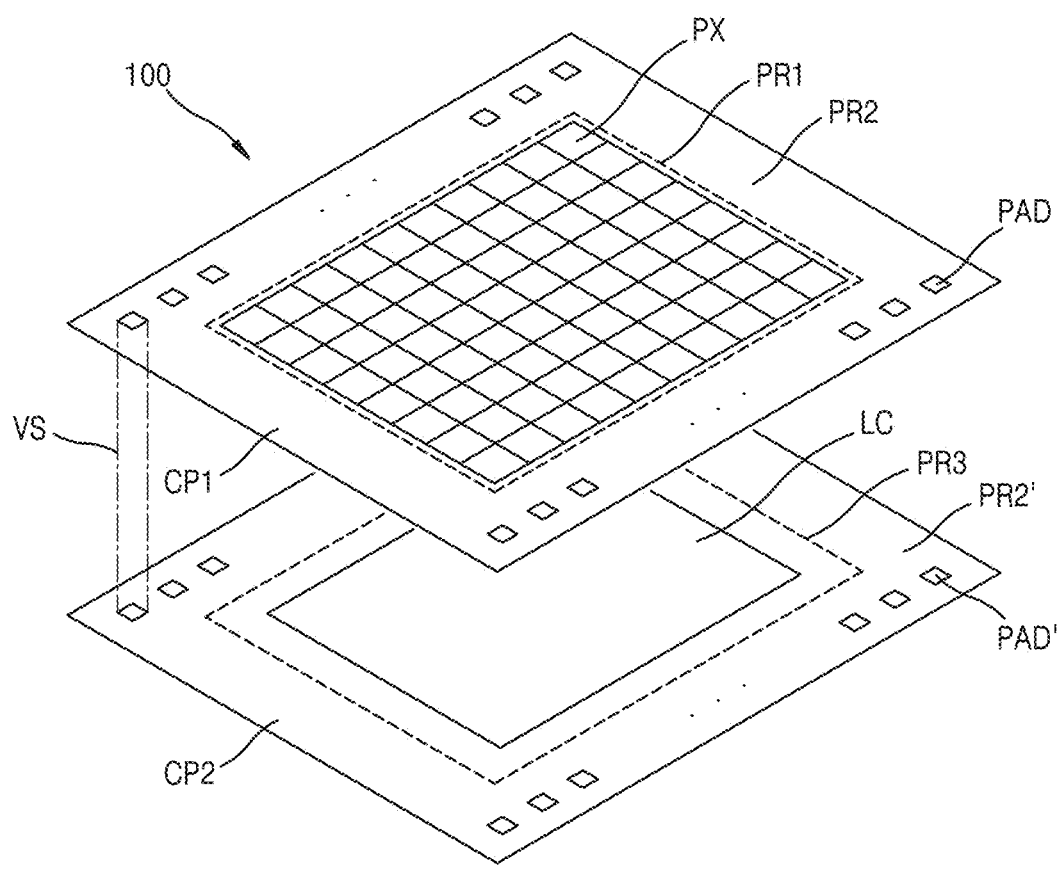
FIG. 13 is a schematic diagram of an image sensor according to some example embodiments.

FIG. 13 is a schematic diagram of the image sensor 100 according to some example embodiments.

Referring to FIG. 13, the image sensor 100 may include a stacked image sensor including a first chip CP1 and a second chip CP2, which are stacked in a vertical direction. The image sensor 100 may be an implementation of the image sensor 100 of FIG. 2.

The first chip CP1 may include a pixel region PR1 and a pad region PR2, and the second chip CP2 may include a peripheral circuit region PR3 and a lower pad region PR2'. A pixel array including a plurality of pixels PX may be formed in the pixel region PR1 and may include the pixel array 110 of FIG. 3, the pixel array 110a of FIG. 6, or the pixel array 110b of FIG. 7.

The peripheral circuit region PR3 of the second chip CP2 may include a logic circuit block LC and a plurality of transistors. For example, the logic circuit block LC may include at least one of the controller 120, the signal processor 130, the row driver 140, and the signal reader 150, which have been described with reference to FIG. 2. The peripheral circuit region PR3 may provide a certain signal to each of the pixels PX of the pixel region PR1 and read a pixel signal output from each of the pixels PX.

The lower pad region PR2' of the second chip CP2 may include a lower conductive pad PAD'. There may be a plurality of lower conductive pads PAD', which may respectively correspond to conductive pads PAD. A lower conductive pad PAD' may be electrically connected by a via structure VS to a conductive pad PAD of the first chip CP1.

Figure 14:
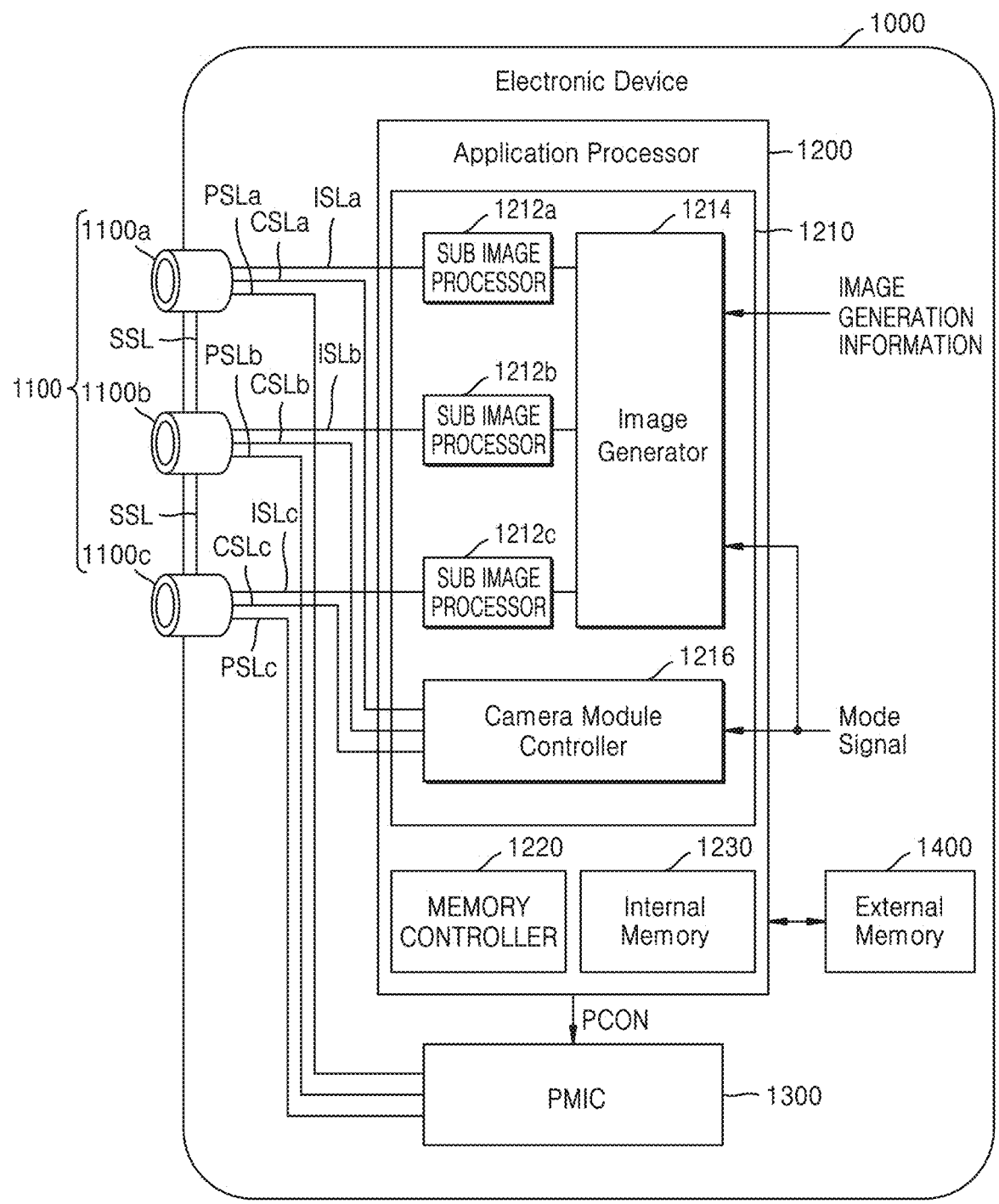
FIG. 14 is a block diagram of an electronic device including a multi-camera module.
Figure 15:
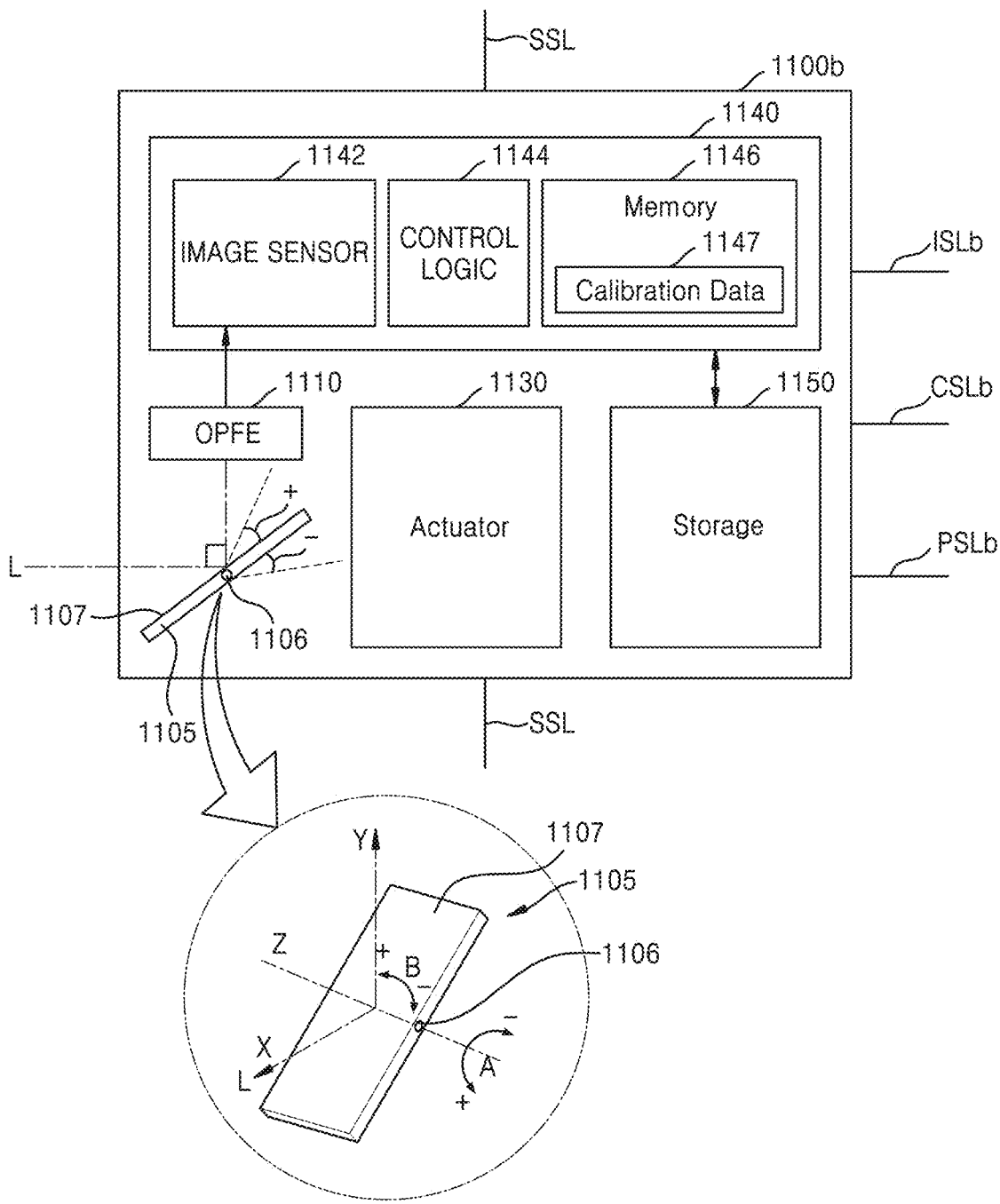
FIG. 15 is a detailed block diagram of a camera module in FIG. 14.

FIG. 14 is a block diagram of an electronic device 1000 including a multi-camera module. FIG. 15 is a detailed block diagram of a camera module 1100b in FIG. 14. The detailed configuration of the camera module 1100b is described with reference to FIG. 15 and may also be applied to other camera modules 1100a and 1100c.

Referring to FIG. 14, the electronic device 1000 may include a camera module group 1100, an application processor 1200, a power management integrated circuit (PMIC) 1300, and an external memory 1400. The camera module group 1100 may include a plurality of camera modules, e.g., the camera modules 1100a, 1100b, and 1100c. Although three camera modules 1100a, 1100b, and 1100c are illustrated in FIG. 14, embodiments are not limited thereto.

Referring to FIGS. 14 and 15, the camera module 1100b may include a prism 1105, an optical path folding element (OPFE) 1110, an actuator 1130, an image sensing device 1140, and a storage 1150.

The image sensing device 1140 may include an image sensor 1142, a control logic 1144, and a memory 1146. The image sensor 1142 may sense an image of an object using light L provided through an optical lens. The memory 1146 may store calibration data 1147. In some example embodiments, the image sensor 1142 may correspond to the image sensor 100 described with reference to FIGS. 1 and 2 and may include at least one selected from the pixel arrays 110, 110a, and 110b described with reference to FIGS. 3, 6, and 7. In other words, the image sensor 1142 may generate RGB image data, CMY image data, or RGBCMY image data.

The control logic 1144 may generally control operations of the camera module 1100b. For example, the control logic 1144 may control operation of the camera module 1100b according to a control signal provided through a control signal line CSLb. The control logic 1144 may control the operation mode of the image sensor 1142. For example, the control logic 1144 may control the image sensor 1142 to operate in the first color mode to generate the RGB image data, in the second color mode to generate the CMY image data, and in the third color mode to generate the RGBCMY image data.

Referring back to FIG. 14, the application processor 1200 may include an image processing unit 1210, a memory controller 1220, and an internal memory 1230. The application processor 1200 may be separately implemented from the camera modules 1100a, 1100b, and 1100c. For example, the application processor 1200 and the camera modules 1100a, 1100b, and 1100c may be implemented in different semiconductor chips.

The image processing unit 1210 may include a plurality of sub image processors 1212a, 1212b, and 1212c, an image generator 1214, and a camera module controller 1216. In some example embodiments, the image processing unit 1210 may correspond to the processor 12 in FIG. 1. In some example embodiments, the image processing unit 1210 may generate red image data, green image data, and blue image data by processing an RGB image data value output from each of the camera modules 1100a, 1100b, and 1100c or generate cyan image data, magenta image data, and yellow image data by processing a CMY image data value output from each of the camera modules 1100a, 1100b, and 1100c. In some example embodiments, the image processing unit 1210 may generate red image data, green image data, and blue image data by processing an RGBCMY image data value output from each of the camera modules 1100a, 1100b, and 1100c.

The image processing unit 1210 may include as many sub image processors 1212a, 1212b, and 1212c as the camera modules 1100a, 1100b, and 1100c. An image data value generated from each of the camera modules 1100a, 1100b, and 1100c may be provided to a corresponding one of the sub image processors 1212a, 1212b, and 1212c through a corresponding one of image signal lines ISLa, ISLb, and ISLc, which are separated from one another. The camera module controller 1216 may provide a control signal to each of the camera modules 1100a, 1100b, and 1100c. A control signal generated by the camera module controller 1216 may be provided to a corresponding one of the camera modules 1100a, 1100b, and 1100c through a corresponding one of control signal lines CSLa, CSLb, and CSLc, which are separated from one another.

While the inventive concepts have been particularly shown and described with reference to example embodiments thereof, it will be understood that various changes in form and details may be made therein without departing from the spirit and scope of the following claims.

What is claimed is:

1. An image sensor comprising:
  a plurality of red pixel groups each including a first red pixel and a second red pixel each configured to sense a red color, the first red pixel and the second red pixel being adjacent to each other in a first direction and sharing a single microlens with each other;
  a plurality of green pixel groups each including a first green pixel and a second green pixel each configured to sense a green color, the first green pixel and the second green pixel being adjacent to each other in the first direction and sharing a single microlens with each other;
  a plurality of blue pixel groups each including a first blue pixel and a second blue pixel each configured to sense a blue color, the first blue pixel and the second blue pixel being adjacent to each other in the first direction and sharing a single microlens with each other; and
  at least one color pixel group including a first color pixel and a second color pixel each configured to sense a certain color, the first color pixel and the second color pixel being adjacent to each other in a second direction and sharing a single microlens with each other, the first direction being perpendicular to the second direction;
  the certain color is different from the red color, the blue color, and the green color; and
  the at least one color pixel group is between the red pixel groups and the green pixel groups and between the green pixel groups and the blue pixel groups.

2. The image sensor of claim 1, wherein
  the plurality of red pixel groups include first to third red pixel groups sequentially adjacent to each other in the second direction,
  the plurality of blue pixel groups include first to third blue pixel groups sequentially adjacent to each other in the second direction,
  the plurality of green pixel groups include first to fourth green pixel groups,
  the first green pixel group, the second green pixel group, and the fourth green pixel group are sequentially adjacent to each other in the second direction,
  the first green pixel group, the third green pixel group, and the fourth green pixel group are sequentially adjacent to each other in the second direction, and
  the second green pixel group and the third green pixel group are adjacent to each other in the first direction.

3. The image sensor of claim 1, wherein the certain color includes at least one selected from a cyan color, a magenta color, and a yellow color.

4. The image sensor of claim 3, wherein the at least one color pixel group includes:
  a cyan pixel group configured to sense the cyan color;
  a magenta pixel group configured to sense the magenta color; and
  a yellow pixel group configured to sense the yellow color,
  wherein a distance from a center of the yellow pixel group to a center of the cyan pixel group is equal to a distance from the center of the yellow pixel group to a center of the magenta pixel group.

5. The image sensor of claim 1, wherein the certain color includes a white color.

6. The image sensor of claim 1, wherein the at least one color pixel group is configured to receive a transfer control signal through a transfer control signal line that is different from a transfer control signal line connected to the plurality of red pixel groups, the plurality of green pixel groups, and the plurality of blue pixel groups, the transfer control signal being configured to control accumulation of photocharge.

7. The image sensor of claim 1, wherein the at least one color pixel group is configured to output a pixel signal through a column output line that is different from a column output line connected to the plurality of red pixel groups, the plurality of green pixel groups, and the plurality of blue pixel groups.

8. An image sensor operating in a first color mode and a second color mode, the image sensor comprising:
   a first pixel group including a plurality of pixels each configured to sense one of a red color, a green color, and a blue color; and
   a second pixel group including a plurality of pixels each configured to sense one of a cyan color, a magenta color, and a yellow color,
   a number of pixels included in the first pixel group is greater than a number of pixels included in the second pixel group, and
   the image sensor is configured to
      generate RGB image data in the first color mode using pixel signals output from the first pixel group and
      generate CMY image data in the second color mode using pixel signals output from the second pixel group.

9. The image sensor of claim 8, wherein the first pixel group includes:
   red pixels configured to sense the red color, two of the red pixels being adjacent to each other in each of first to third consecutive rows;
   green pixels configured to sense the green color, two of the green pixels being adjacent to each other in a first row, four of the green pixels being adjacent to one another in a second row, and two of the green pixels being adjacent to each other in a third row, the first to third rows being consecutive; and
   blue pixels configured to sense the blue color, two of the blue pixels being adjacent to each other in each of first to third consecutive rows.

10. The image sensor of claim 8, wherein the second pixel group includes:
    a first cyan pixel and a second cyan pixel adjacent to each other and configured to sense the cyan color; and
    a first yellow pixel and a second yellow pixel adjacent to each other and configured to sense the yellow color.

11. The image sensor of claim 10, wherein
    a single microlens is above the first and second cyan pixels, and
    a single microlens is above the first and second yellow pixels.

12. The image sensor of claim 10, wherein the second pixel group further includes a first magenta pixel and a second magenta pixel adjacent to each other and sensing the magenta color.

13. The image sensor of claim 8, wherein
    a transfer control signal line of the first pixel group is different from a transfer control signal line of the second pixel group, and
    a transfer control signal for controlling accumulation of photocharge is configured to be provided to each of the transfer control signal lines.

14. An image sensor comprising:
    a plurality of red sharing pixel groups each including a plurality of red pixels configured to sense a red color and sharing a floating diffusion region with each other;
    a plurality of green sharing pixel groups each including a plurality of green pixels configured to sense a green color and sharing a floating diffusion region with each other;
    a plurality of blue sharing pixel groups each including a plurality of blue pixels configured to sense a blue color and sharing a floating diffusion region with each other; and
    a plurality of color pixel groups each including a plurality of color pixels configured to sense a certain color and sharing a floating diffusion region with each other,
    the certain color is different from the red color, the green color, and the blue color;
    a number of green pixels included in each of the plurality of green sharing pixel groups is greater than a number of red pixels included in each of the plurality of red sharing pixel groups; and
    the number of red pixels included in each of the plurality of red sharing pixel groups is greater than a number of color pixels included in each of the plurality of color pixel groups.

15. The image sensor of claim 14, wherein each of the plurality of red sharing pixel groups includes six red pixels, each of the plurality of green sharing pixel groups includes eight green pixels, and each of the plurality of blue sharing pixel groups includes six blue pixels.

16. The image sensor of claim 14, wherein a distance from a center of one red sharing pixel group among the plurality of red sharing pixel groups to a center of a green sharing pixel group closest to the one red sharing pixel group among the plurality of green sharing pixel groups is equal to a distance from a center of one blue sharing pixel group among the plurality of blue sharing pixel groups to a center of a green sharing pixel group closest to the one blue sharing pixel group among the plurality of green sharing pixel groups.

17. The image sensor of claim 14, wherein the plurality of red sharing pixel groups, the plurality of green sharing pixel groups, and the plurality of blue sharing pixel groups are arranged in a Bayer pattern.

18. The image sensor of claim 14, wherein one red sharing pixel group among the plurality of red sharing pixel groups and one color pixel group among the plurality of color pixel groups share a floating diffusion region with each other.

19. The image sensor of claim 14, wherein the certain color is one of a cyan color, a magenta color, and a yellow color; and each of the plurality of color pixel groups includes two color pixels.

20. The image sensor of claim 14, wherein the plurality of red pixels include a first red pixel and a second red pixel adjacent to each other in a first direction and sharing a single microlens with each other,
    the plurality of green pixels include a first green pixel and a second green pixel adjacent to each other in the first direction and sharing a single microlens with each other,
    the plurality of blue pixels include a first blue pixel and a second blue pixel adjacent to each other in the first direction and sharing a single microlens with each other, and
    the plurality of color pixels include a first color pixel and a second color pixel adjacent to each other in a second direction that is perpendicular to the first direction and sharing a single microlens with each other.

* * * * *